United States Patent [19]

Mori

[11] Patent Number: 5,457,696
[45] Date of Patent: Oct. 10, 1995

[54] SEMICONDUCTOR MEMORY HAVING INTERNAL TEST CIRCUIT

[75] Inventor: Toshiki Mori, Osaka, Japan

[73] Assignee: Matsushita Electric Industrial Co., Ltd., Osaka, Japan

[21] Appl. No.: 925,159

[22] Filed: Aug. 6, 1992

[30] Foreign Application Priority Data

Aug. 8, 1991 [JP] Japan .................................. 3-199129
Nov. 6, 1991 [JP] Japan .................................. 3-289687

[51] Int. Cl.$^6$ ................................................. G11C 29/00
[52] U.S. Cl. ........................ 371/21.3; 324/210; 365/201
[58] Field of Search ............................. 371/21.3, 21.2; 324/210, 211, 212; 365/201

[56] References Cited

U.S. PATENT DOCUMENTS

| | | | |
|---|---|---|---|
| 4,464,750 | 8/1984 | Tatematsu | 371/21.2 |
| 4,654,827 | 3/1987 | Childers | 365/201 |
| 4,654,849 | 3/1987 | White, Jr. | 371/21.3 X |
| 4,868,823 | 9/1989 | White, Jr. | 371/21.3 |
| 4,916,661 | 4/1990 | Nawaki | 365/51 |
| 5,060,230 | 10/1991 | Arimoto | 371/21.2 |
| 5,124,945 | 6/1992 | Schreck | 365/185 |
| 5,185,744 | 2/1993 | Arimoto | 371/21.3 X |
| 5,216,678 | 6/1993 | Nawaki | 371/68.1 |
| 5,311,473 | 5/1994 | McClure | 365/201 |

FOREIGN PATENT DOCUMENTS 3120483  5/1991  Japan .

*Primary Examiner*—Robert W. Beausoliel, Jr.
*Assistant Examiner*—Glenn Snyder
*Attorney, Agent, or Firm*—Lowe, Price, LeBlanc & Becker

[57] ABSTRACT

A random access semiconductor memory having an array of memory cells is provided with an internal test circuit for testing the contents of rows of stored test pattern data which are read from the array in units of data rows, each read from an entire row of cells of the array. The test circuit can be based on a set of transistors which are respectively coupled to the bit lines of the cell array, for detecting coincidence between the states of all of the bits of a data row that is read out, or coincidence between the states of a predetermined set of the row bits.

8 Claims, 14 Drawing Sheets

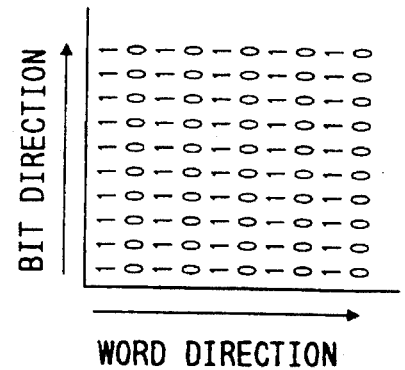
FIG. 7(d)
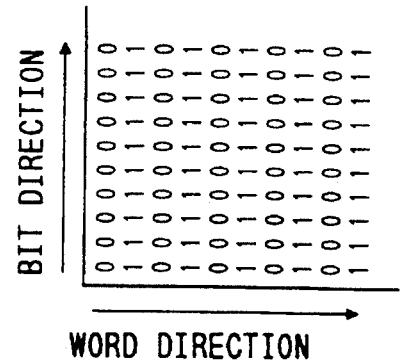
FIG. 7(c)
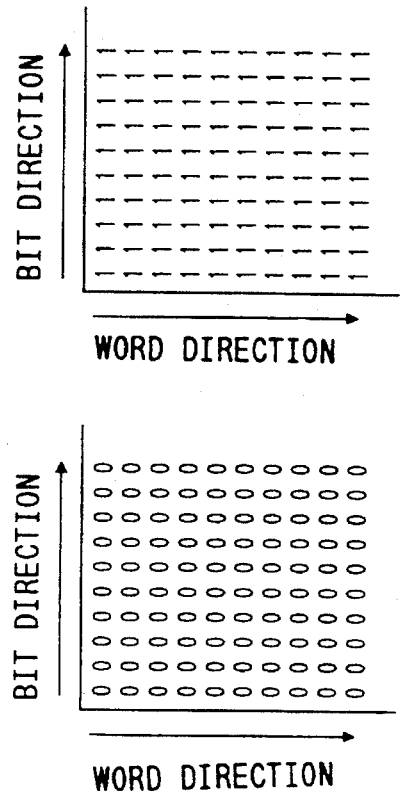
FIG. 7(b)
FIG. 7(a)
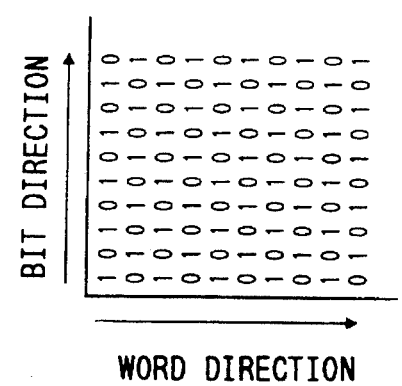
FIG. 7(h)
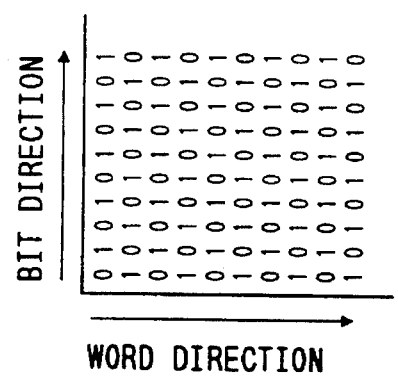
FIG. 7(g)
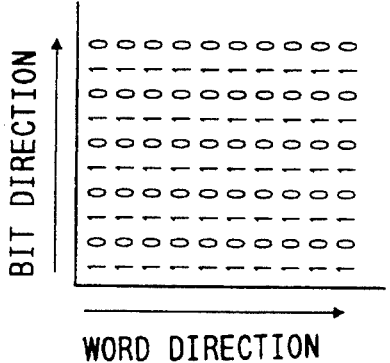
FIG. 7(f)
FIG. 7(e)

SEMICONDUCTOR MEMORY HAVING INTERNAL TEST CIRCUIT

BACKGROUND OF THE INVENTION

1. Field of the Invention

The present invention relates to a semiconductor memory, and in particular to a semiconductor memory which includes an internal test circuit for use in rapidly testing an array of memory cells of the semiconductor memory.

2. Description of the Related Art

With advances which have been made in recent years in semiconductor memory manufacturing technology, there has been a substantial increase in the number of elements which can be formed within a single chip of an integrated circuit. In the case of a dynamic random-access memory (hereinafter referred to as a DRAM), the storage capacity of one chip can now be as high as 16 to 64 megabits, while in the case of a static random access memory (hereinafter referred to as a SRAM), the storage capacity of one chip can be of the order of 4 to 16 megabits. With further advances that can be expected in future semiconductor device technology, greater increases can be anticipated in the amount of storage capacity achievable on one chip. One extremely effective approach to increasing the storage capacity per chip, in the case of a DRAM or SRAM, is to minimize the number of circuit elements, as far as possible. However in the case of a very large-capacity semiconductor memory, due to limitations of package size, number of IC pins, amount of power consumption, etc., it has also been found necessary to minimize the bit width (i.e. the number of bits which are conveyed in parallel) of the data I/O interface between the memory and the exterior. In the case of a 16 megabit semiconductor memory for example, typical values used at present for the I/O data bit width are 1 bit, 4 bits, or 8 bits. Use of such a small value of I/O data bit width has the disadvantage that a very long time is required to test all of the memory cells. In the case of a 16 megabit semiconductor memory having a 1-bit I/O data bit width, for example, only one bit can be written into or read out from the memory cells at each memory access operation. Thus to read or write data to or from all of the memory cells, it is necessary to perform a total of at least 16 million accesses. Considering the case in which the "0" state and the "1" state have each to be written into and read out of every memory cell of a 16 megabit semiconductor memory in order to test all of the cells, it becomes necessary to execute a total of (4×16,000,000) accesses. Thus the time required for memory testing becomes excessively long.

In the prior art, as attempts to reduce that problem of excessively long test time, methods have been proposed such as making the bit width of the internal data bus of the memory chip greater than the external I/O data bit width. In that way, by supplying test data from the exterior and then expanding the test data to the larger bit width of the internal bus, the number of memory cells which can be written or read by a single memory access operation can be increased. Moreover it becomes possible to execute internal comparison operations to determine whether data which are written into memory cells are identical to data that are subsequently read out from the cells, with only the comparison results being sent out from the memory to the exterior. The time required for memory testing can thereby be further reduced.

In general, a video memory (referred to hereinafter as a VRAM) is a dual-port memory which is made up of a random access memory (referred to hereinafter as a RAM) with a corresponding random access I/O port, and a serial access memory (referred to hereinafter as a SAM) together with a corresponding serial access I/O port. At present, storage capacity values of 1 to 4 megabits can be achieved for the RAM section of a 1-chip VRAM. The above problem of a long time being required for memory testing also arises with the RAM section of a VRAM. In the prior art, testing of the RAM section of a VRAM has been executed in the same way as for testing a DRAM or SRAM, by utilizing the random access port to the RAM section of the memory, to input test data and to output the test results.

FIG. 1A illustrates a memory cell array in an example of a prior art DRAM, which employs the folded bit line technique, whereby each bit is read out from a pair of memory cells as a differential signal appearing on a pair of bit lines, in order to achieve a high speed of operation. FIG. 1B is a circuit diagram of a portion of the circuit of FIG. 1A, for describing differential data read and write operations. In FIG. 1A, numeral 1 denotes the memory cell array, in which respective memory cells are designated as MC. Respective word line data rows are stored in corresponding rows of the memory cells MC, and an arbitrary one of these word line data rows can be selected during a read or write access operation by applying a selection signal to a corresponding one of the word lines (WL0, WL1, ... WLn). In practice, the word line selection is determined (by means which are well known in the art and are omitted from the drawings for simplicity) by bits of an address which is supplied to the memory at the time of the read or write access. A selected word line data row is read out as a set of differential signals (i.e. appearing between the bit line pair BL0/BL0, the pair BL1/BL1, and so on) which are transferred via the pairs of bit lines to respective ones of a set of differential sense amplifiers 2, to be amplified thereby. With the folded bit line technique, the successive rows of memory cells are alternately designated as normal phase rows and inverse phase rows. This signifies that in each of the memory cells of a normal phase row (i.e. the rows which are selected by the word lines WL0, WL2, ... WLn), a "1" state bit is represented by a high (e.g. positive) potential, referred to in the following as the "high" level, while a "0" state bit is represented by a low (e.g. zero) potential, referred to in the following as the "low" level. However in each of the memory cells of an inverse phase row, a "1" state bit is represented by the "low" level while each "0" state bit is represented by the "high" level. The even-numbered word lines (WL0, WL2, ... ) will therefore be referred to as the normal phase word lines, and the odd-numbered word lines (WL1, WL3, ... ) as the inverse phase word lines, and the bit lines connected to the normal phase memory cells and to the inverse phase memory cells will similarly be referred to as the normal phase bit lines and inverse phase bit lines.

When a word line data row is selected by addressing the corresponding word line, then resultant amplified differential signals representing the data are produced from the set of differential sense amplifiers 2. A set of these differential signals, representing a number of bits which is equal to the data bit width of the internal data bus 4, is selected from all of the differential signals, by the column selectors 3, and transferred to the internal data bus 4. That is to say, each bit that is read out from or written into the memory cell array 1 from or to the exterior of the memory is transferred as a differential signal via a pair of lines of the internal data bus 4. The read operation will be described referring to FIG. 1B, in which two of the array of memory cells 1, positioned at the intersections of the word lines WL0, WL1 and the bit lines Bl0, BL0 are designated as $MC_a$ and $MC_b$, respectively, the corresponding column selection transistors as 3a, 3b respectively, and the corresponding data lines of the internal data bus 4 as 4a, 4b. Normally the bit lines BL0, BL0 are held at a potential which is midway between the "high" and "low" levels. As a result, if a "1" state bit is stored in $MC_a$ and the word line WL0 is addressed to thereby read out the contents of memory cell $MC_a$, a "high" level output will be supplied via the column selector 3a to the data line 4a and a "low" level output to the column selector 3b to the data line 4b, from the sense amplifier 2a. A "high" level output, representing a "1" state bit will thereby be produced from the read amplifier, to be transferred to the external I/O data interface of the chip. If on the other hand a "1" state bit is stored in the memory cell $MC_b$, and the word line WL1 is addressed, then the "low" state contents of $MC_b$ will appear on the bit line BL0, so that again the sense amplifier 2a will supply a "high" level output to the data line 4a and a "low" level output to the data line 4b.

In a similar way, if "0" state data are stored in each of the memory cells $MC_a$, $MC_b$, the data lines 4a, 4b will be set to the "low" and "high" levels respectively when either of these memory cells is read out.

It can thus be understood that with such a folded bit line configuration, the number of conductors constituting the internal data bus 4 will be twice the data bit width of the internal data bus, since each bit must be transferred by a pair of data lines of that bus.

The above description has been given assuming that the semiconductor memory is a DRAM, however a similar internal configuration, using such a folded bit line technique with data transferred as differential signal values, is commonly used for a SRAM also.

As described hereinabove, the data bit width of the internal data bus 4 may be made larger than that of the external I/O interface.

FIG. 2 illustrates, in general form, the internal configuration of a prior art type of video random access memory (referred to in the following as a VRAM). The VRAM 100 is formed of a RAM (random access memory) 101 and a SAM (serial access memory) 102, together with a random data I/O port 103 and address input port 107 for the RAM 101, and a serial data I/O port 105 and serial clock input terminal 106 for the SAM 102. Control signals for controlling the operation of the VRAM 100 are supplied from an input terminal 104. An arbitrary row of data (e.g. the data for one scan line of a video signal frame) stored in a row of memory cells of the RAM 101 can be transferred in parallel from bit line outputs of the RAM 101 to the SAM 102, to be then outputted serially from the serial data I/O port 105 in synchronism with the serial clock signal. Data can also be transferred serially in via the serial port 105 to the SAM 102 in synchronism with the serial clock signal, whereby an arbitrary row of data can be written in parallel into the RAM 101 from the SAM 102. The internal configuration of the RAM 101 is generally as shown in FIG. 1A and described hereinabove. Respective bit lines of the RAM 101 are coupled (via sense amplifiers) to corresponding parallel inputs of the SAM 102, i.e. data rows which are transferred in parallel between the RAM 101 and the SAM 102 correspond to the word line data rows of the DRAM of FIG. 1A described above. In the prior art, during testing of the RAM 101, in the same way as described for the memory of FIG. 1A, read and write data are transferred via the random data I/O port 103. To maximize the speed of memory testing by prior art methods, the data bit width of an internal data bus in the RAM 101 which communicates with the random data I/O port is made greater than that of the external I/O data bit width, as described hereinabove. That is to say, during each memory access operation in memory testing by a prior art method, the data bit width of that internal data bus is utilized for reading/writing from/to the memory cells.

With such prior art types of semiconductor memory, in which the data bit width of the internal data bus is increased in order to increase the number of bits which can be simultaneously written into or read out from the memory cells in each memory access, to thereby reduce the time required for memory testing, the bit width of the internal data bus would typically be made 16 bits, for example. Thus the internal data bus would have a total of 32 conductors. Hence, if the bit width of the internal data bus is made large, the area of the chip surface that is occupied by the internal data bus will become excessively large, so that the overall chip size will tend to be increased. An increase in chip size will result in problems of increased levels of connecting lead resistance and capacitance, which will cause a lowering of performance.

Thus it is difficult to achieve a sufficient reduction of the amount of time required for testing a semiconductor memory having a very large degree of storage capacity, simply by increasing the data bit width of the internal data bus of the memory. This problem will become more severe in the case of new types of semiconductor memory which can be expected to be developed in the future, having even greater values of storage capacitance than those which are currently available.

SUMMARY OF THE INVENTION

It is an objective of the present invention to overcome the problems described above which arise with regard to testing a large-scale semiconductor memory. To achieve that objective, the present invention provides a simple built-in test circuit within the semiconductor memory, whereby the time required to test all of the memory cells to be substantially reduced, by comparison with the prior art.

More specifically, according to a first aspect, the present invention provides, in a semiconductor memory circuit having an array of memory cells, word lines respectively addressable for selecting an arbitrary row of memory cells of the array to read out a stored data row as a data unit, and a plurality of sense amplifiers coupled via respective bit lines to columns of memory cells of the array for amplifying respective bits of the selected data row, memory test circuit means comprising detection means for detecting that an arbitrarily predetermined plurality of bits of the selected data row, amplified by the sense amplifiers, are in a mutually identical logic state.

The detection means preferably comprises a plurality of field effect transistors having respective gate electrodes coupled through the sense amplifiers to respective ones of a set of the bit lines corresponding to the predetermined plurality of bits, with the drain electrodes of the field effect transistors being connected in common to a fixed resistive load.

Moreover the detection means can comprise first coincidence detection means for detecting that bits constituting the data row are all in a "0" logic state and second coincidence detection means for detecting that the bits are all in a "1" logic state.

In the case of a semiconductor memory circuit of a type in which the memory cells are divided into normal-phase memory cells in which the "1" and "0" state bits of the stored data are represented by high and low potentials respectively, and inverse phase memory cells in which the "1" and "0" state bits of stored data are represented by low and high potentials respectively, the normal phase memory cells being respectively coupled to corresponding normal phase bit lines and the inverse phase memory cells being respectively coupled to corresponding inverse phase bit lines, the first coincidence detection means preferably comprises a first plurality of field effect transistors having gate electrodes coupled through the sense amplifiers to respective ones of the normal phase bit lines and having drain electrodes connected in common to a first fixed resistive load, and the second coincidence detection means preferably comprises a second plurality of field effect transistors gate electrodes coupled through the sense amplifiers to respective ones of the inverse phase bit lines and having drain electrodes connected in common to a second fixed resistive load.

According to a second aspect, the present invention provides, in a semiconductor memory circuit having an array of memory cells, word lines respectively addressable for selecting an arbitrary row of memory cells of the array to read out a data row as a data unit, and a plurality of sense amplifiers coupled via respective bit lines to columns of memory cells of the array for amplifying respective bits of the data row, memory test circuit means comprising detection means for detecting that bits constituting the data row, amplified by the sense amplifiers, are in an arbitrarily predetermined combination of "1" and "0" logic states.

If the memory circuit is of the aforementioned type in which the memory cells are divided into normal-phase memory cells in which "1" and "0" state bits of the stored data are represented by high and low potentials respectively, and inverse phase memory cells in which the "1" and "0" state bits of stored data are represented by low and high potentials respectively, then the detection means is preferably formed of a plurality of field effect transistors with gate electrodes of a first set of the plurality of field effect transistors being connected through the sense amplifiers to respective ones of the inverse phase bit lines which correspond to bits of the data row that are to be tested for the "1" logic state, and with gate electrodes of a second set of the plurality of field effect transistors being connected through the sense amplifiers to respective ones of the normal phase bit lines which correspond to bits of the data row that are to be tested for the "0" logic state, and with respective drain electrodes of the first and second sets being connected in common to a fixed resistive load, the sets being respectively predetermined in accordance with the aforementioned combination of "1" and "0" logic states.

According to a third aspect, the present invention provides, in a semiconductor memory circuit having an array of memory cells, word lines respectively addressable for selecting an arbitrary row of memory cells of the array to read out a data row as a data unit, and a plurality of sense amplifiers coupled via respective bit lines to columns of memory cells of the array for amplifying respective bits of the data row, memory test circuit means comprising:

first coincidence detection means for detecting that all odd-numbered bits of the data row, as counted along a row direction of the memory cell array, are in a first logic state, and that all even-numbered bits of the data row are in a second logic state; and second coincidence detection means for detecting that all of the odd-numbered bits of the data row are in the second logic state, and that all of the even-numbered bits are in the first logic state.

If the semiconductor memory circuit is of the type wherein the memory cells are divided into normal-phase memory cells in which "1" and "0" state bits of the stored data are represented by high and low potentials respectively, and inverse phase memory cells in which the "1" and "0" state bits of stored data are represented by low and high potentials respectively, the normal phase memory cells being respectively coupled to corresponding normal phase bit lines and the inverse phase memory cells being respectively coupled to corresponding inverse phase bit lines, then the first coincidence detection means is preferably formed of a first plurality of field effect transistors having gate electrodes coupled through the sense amplifiers to respective ones of the normal phase bit lines and with drain electrodes of even-numbered ones of the first plurality of field effect transistors being connected in common to a fixed resistive load and odd-numbered ones of the normal phase bit lines being connected in common to a second fixed resistive load, and the second coincidence detection means is preferably formed of a second plurality of field effect transistors having gate electrodes coupled through the sense amplifiers to respective ones of the inverse phase bit lines, with respective drain electrodes of odd-numbered ones of the second plurality of field effect transistors being connected in common to the first resistive load and respective drain electrodes of even-numbered ones of the second plurality of field effect transistors being connected in common to the second resistive load.

According to a fourth aspect, the present invention provides, in a semiconductor memory circuit having an array of memory cells, word lines respectively addressable for selecting an arbitrary row of memory cells of the array to read out a data row as a data unit, and a plurality of sense amplifiers coupled via respective bit lines to columns of memory cells of the array for amplifying respective bits of the data row, memory test circuit means comprising:

coincidence detection means for detecting that all bits of the data row are in a "1" logic state and producing a first output signal as a detection result, for detecting that all bits of the data row are in a "0" logic state and producing a second output signal as a detection result, for detecting that all even-numbered bits of the data row are in a "0" logic state and all odd-numbered bits of the data row are in a "1" logic state and producing a third output signal as a detection result, for detecting that all even-numbered bits of the data row are in a "1" logic state and all odd-numbered bits of the data row are in a "0" logic state and producing a fourth output signal as a detection result;

signal combining means for producing a plurality of predetermined combinations of the first, second, third and fourth output signals; and test mode selection means controllable for selecting one of the combinations in accordance with a predetermined data pattern that has been previously stored in the memory cells as the data row.

According to a fifth aspect, the present invention provides, in a video random access memory circuit including a random access memory having an array of memory cells, a serial access memory and a serial data input/output port, and means for writing into the serial access memory a data row which is transferred serially through the serial data input/ output port, for writing the data row in parallel into an arbitrarily selected row of the array of memory cells of the random access memory, for reading the contents of an arbitrarily selected one of the rows of memory cells as a data row and writing the data row in parallel into the serial access memory, and for reading the data row from the serial access memory to be transferred out through the serial data input/output port, memory test means consisting of coincidence detection means for detecting that respective bits of a data row read from the memory cell array are all in a predetermined logic state.

According to a sixth aspect, the present invention provides, in such a video random access memory circuit, memory test means comprising:

first coincidence detection means for detecting that all odd-numbered bits of the data row read from the array of memory cells, as counted along a row direction of the memory cell array, are in a first logic state, and that all even-numbered bits of the data row are in a second logic state; and second coincidence detection means for detecting that all of the odd-numbered bits of the data row are in the second logic state, and that all of the even-numbered bits are in the first logic state.

According to a seventh aspect the present invention provides, in such a video random access memory circuit, memory test means formed of coincidence detection means for detecting that all bits of the data row are in a "1" logic state and producing a first output signal as a detection result, for detecting that all bits of the data row are in a "0" logic state and producing a second output signal as a detection result, for detecting that all even-numbered bits of the data row are in a "0" logic state and all odd-numbered bits of the data row are in a "1" logic state, and producing a third output signal as a detection result, for detecting that all even-numbered bits of the data row are in a "1" logic state and all odd-numbered bits of the data row are in a "0" logic state, and producing a fourth output signal as a detection result, and test mode selection means controllable for selecting one of the first, second, third and fourth output signals in accordance with a predetermined data pattern that has been previously stored in the memory cells as the data row.

According to an eighth aspect the present invention provides, in such a video random access memory circuit, memory test circuit means for comparing a data row that is read out from the memory cells with the data row in a condition prior to being written into and read out from the memory cells.

Such a memory test circuit preferably comprises recirculating shift register means, comparator means for comparing respective bits of a test data row which is being serially read out from the serial data input/output port after having been written into and read out from a row of the memory cells of the random access memory, with corresponding bits of the test data row which are recirculating in the recirculating shift register means, to serially produce respective bits of test result data, and selector circuit means coupled between the serial data input/output port and each of the comparator means and recirculating shift register means and controlled by an externally supplied test mode signal, for transferring arbitrary data between the serial access memory and the serial data input/output port in a normal mode of operation and for transferring the test result data from the comparator means to the serial data input/output port in a test mode of operation.

Alternatively, such a memory test circuit means for a video random access memory circuit can consist of a coincidence detection circuit for comparing respective bits of a test data row, which are being read out from the random access memory after having been written into a row of memory cells of that memory, with corresponding bits of the test data row which are held in the serial access memory, and for producing a bi-level output signal as a test result.

When the present invention is applied to a dynamic random access memory or a static random access memory in which data are stored in alternating rows of normal phase memory cells and inverse phase memory cells, it becomes possible to easily detect by a single memory access whether all of that row of stored data (or an arbitrarily determined portion of that row of stored data) are all in the "0" state or are all in the "1" state. Since the number of bits in a word line data row will be very much greater than the data bit width of the internal data bus, a substantial reduction in the time required for testing the memory cell array can be achieved, by comparison with prior art arrangements for semiconductor memory testing.

Moreover when the present invention is applied to a video memory formed of a random access memory and a serial access memory it becomes possible to write into a row of memory cells of the random access memory, by a single memory access operation, a row of data of an arbitrary test pattern, and to then immediately obtain the results of a test executed using that row of test data. In addition, it is possible to rapidly write the same row of test pattern data into each of the rows of memory cells of the random access memory from the SAM, or to write an arbitrary row of test pattern data into an arbitrarily selected row of memory cells of the random access memory from the SAM.

BRIEF DESCRIPTION OF THE DRAWINGS

FIGS. 7(a)–(h) show eight different test patterns which can be written into the memory cells of a semiconductor memory;

DESCRIPTION OF PREFERRED EMBODIMENTS

Figure 1A:
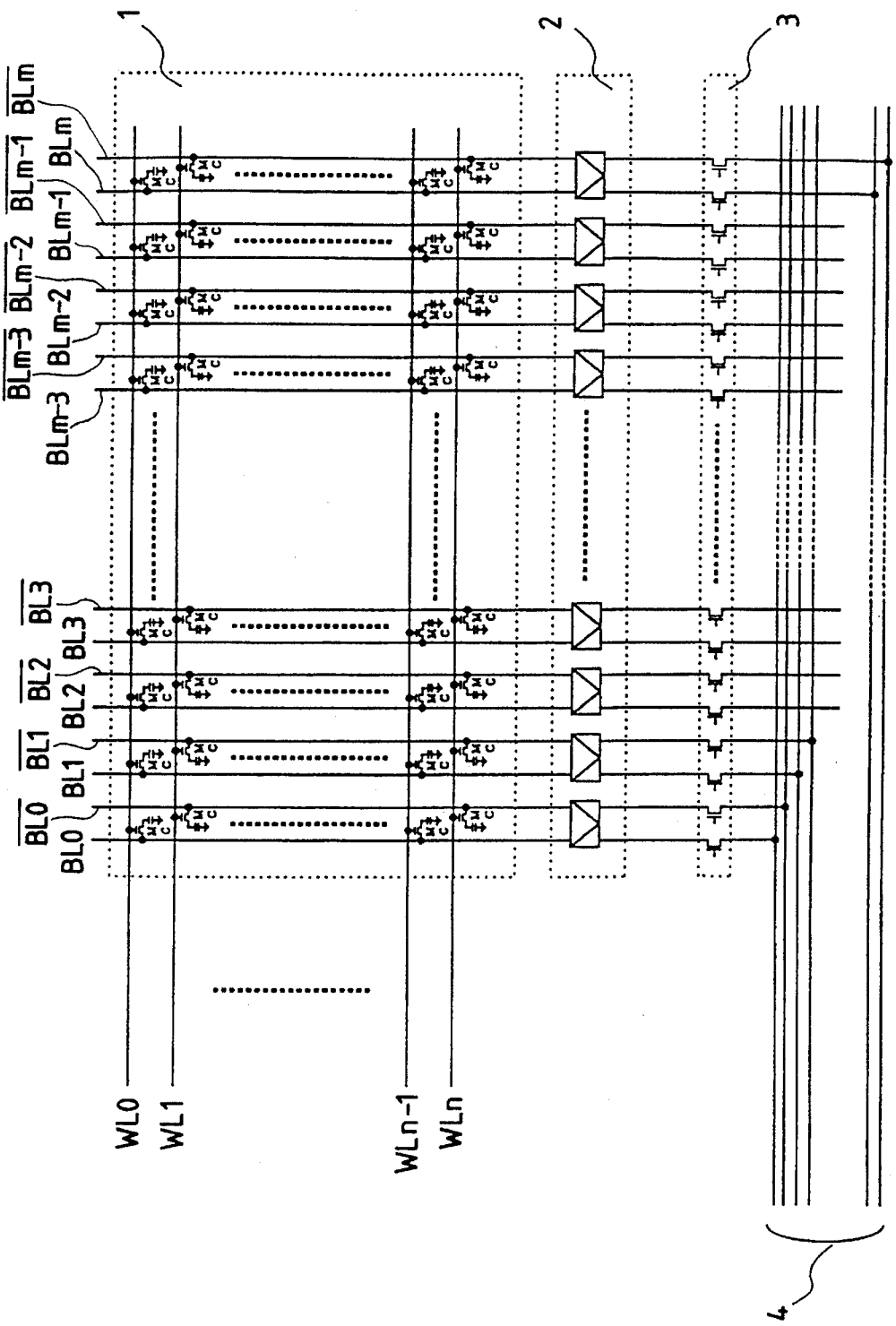
FIG. 1A is a partial circuit diagram of a prior art RAM, showing an array of memory cells.
Figure 1B:
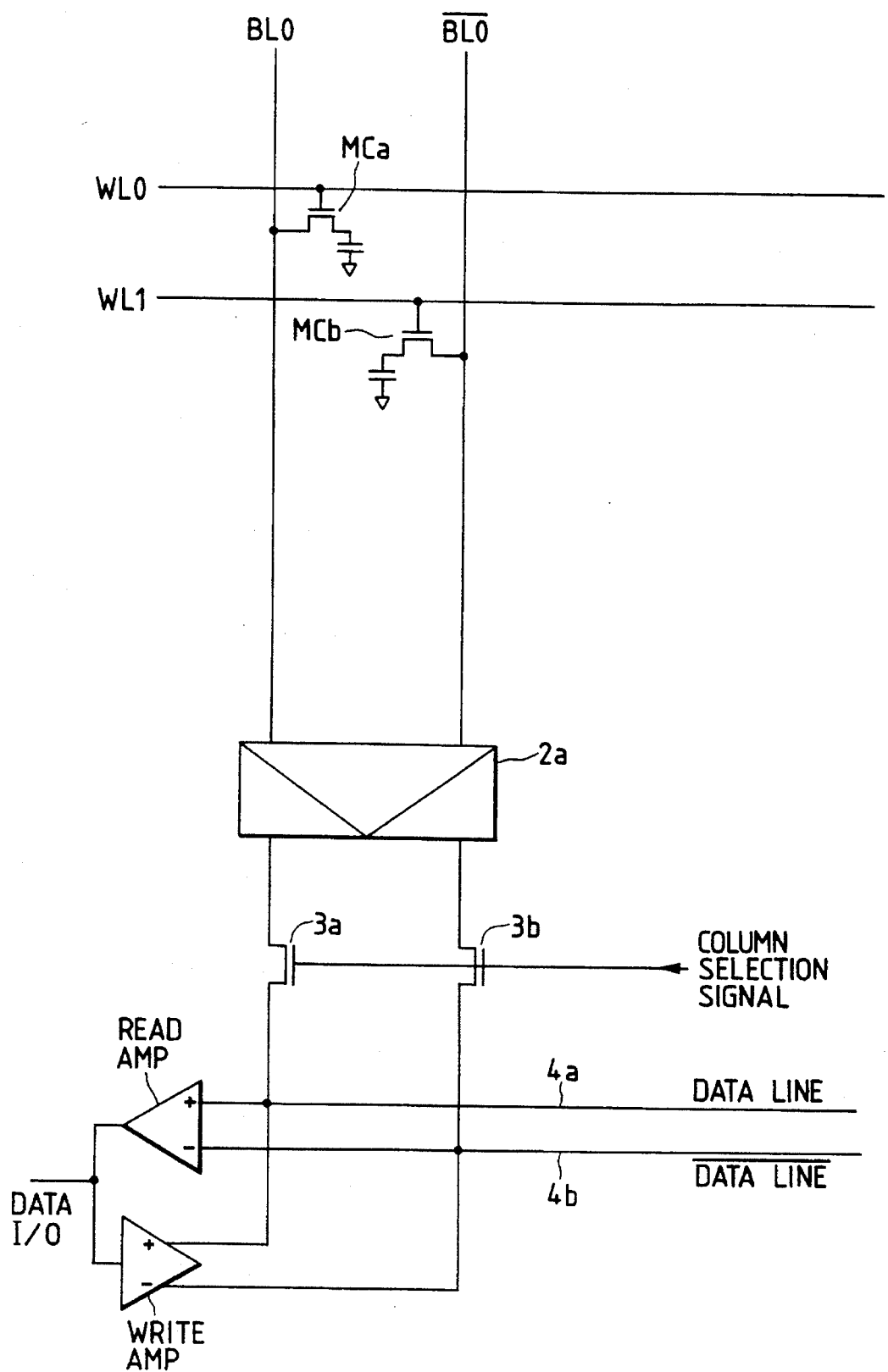
FIG. 1B shows details of part of FIG. 1A.
Figure 3:
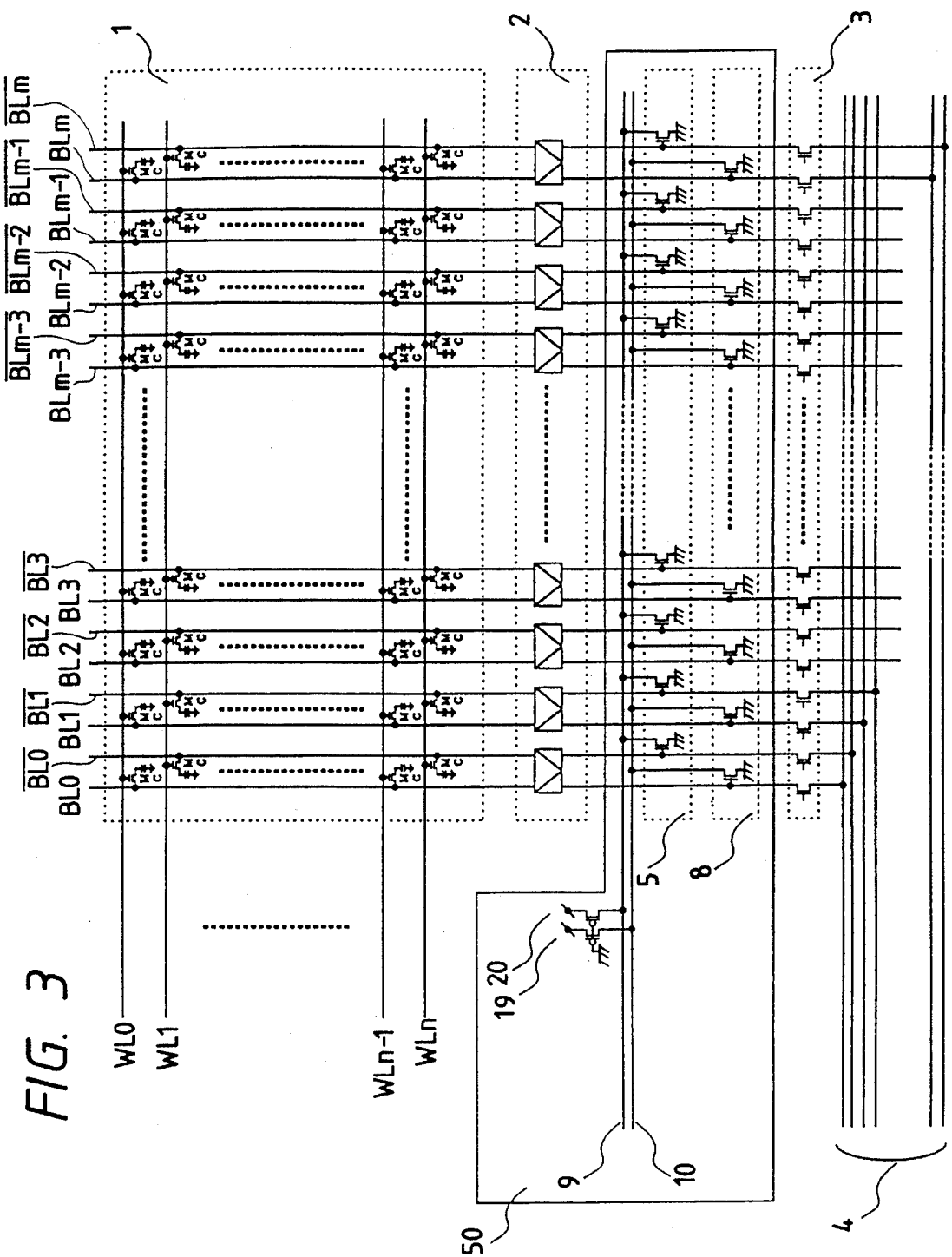
FIG. 3 is a partial circuit diagram of a first embodiment of the present invention, which is a RAM according to the present invention incorporating a memory test circuit which detects an all "0" state or all "1" state of a selected data row.

FIG. 3 shows a memory cell array section of a DRAM, which incorporates a first embodiment of the present invention. The DRAM utilizes the aforementioned folded bit line technique, whereby stored contents of memory cells which are read out will appear as differential signals between pairs of bit lines (BL0/BL0, BL1/BL1, ... BLm/BLm), which are amplified by respective differential sense amplifiers 2. As for the prior art example of FIG. 1A described above, 1 denotes a memory cell array, and a specific set of bits read out from an arbitrarily selected word line data row (selected by a selection signal applied to the corresponding one of the word lines (WL0, WL1, ... WLn)), equal in number to the data bit width of the internal data bus 4, are selected by the column selectors 3 as a set of differential output signals produced from the sense amplifiers 2 and transferred to the internal data bus 4. The embodiment of FIG. 3 is characterized in a memory test circuit 50, which is used to monitor the output signal levels produced from the sense amplifiers 4 when a selected word line data row is read. More specifically, the memory test circuit 50 serves to detect whether all of the outputs produced from the selected row of memory cells (after amplification by the sense amplifiers 2) correctly represent the "1" bit value or all correctly represent the "0" value. The memory test circuit 50 includes a first set of n-channel FETs 5 and a second set of n-channel FETs 8, with the source electrodes of all of these FETs being connected to ground potential (i.e. the aforementioned "low" level), with the gate electrodes of the n-channel FETs 8 being respectively connected via the sense amplifiers 2 to corresponding ones of the normal phase bit lines (BL0, BL1, BL2, ... BLm), and with the gate electrodes of the n-channel FETs 5 being respectively connected via the sense amplifiers 2 to corresponding ones of the inverse phase bit lines (BL0, BL1, BL2, ... BLm). The drain electrodes of all of the set of FETs 5 are connected in common to a connecting line 9, and the drain electrodes of all of the set of FETs 8 are connected in common to a connecting line 10. The respective potential levels of the lines 9 and 10 can be monitored from the exterior of the DRAM, during a memory test operation. The lines 9 and 10 are respectively connected through p-channel FETs 20 and 19, functioning as respective resistive loads for the sets of transistors 5 and 8 respectively, to a positive supply voltage (corresponding to the "high" level).

When a word line data row is selected to be read out, for example by addressing the word line WL0, and if for example the contents of that word line data row are all in the logic "0" state, then the contents of the memory cells for that data row will all be at the "low" level Hence, "low" level outputs will be produced on each of the normal phase bit lines (BL0, BL1, BL2, ... ,BLm). In that case, all of the set of transistors 8 will receive "low" level output signals from the sense amplifiers 2, and will be set in the OFF (i.e. non-conducting) state, so that the line 10 will be at the "high" potential, while all of the transistors 5 will be set in the ON state, so that the line 9 will be set at the "low" potential. If one or more of the normal phase bit lines goes to the "high" state, due to a defective memory cell, then the corresponding one of the transistors 8 will be set in the ON state, causing the line 10 to go to the "low" potential. In this case therefore, the state of the line 10 is monitored, to obtain the test result for a word line data row containing all "0" data.

It will be understood that the above is also true when an inverse phase bit line, e.g. WL1 is selected for reading out the corresponding word line data row, if all "0" data have been stored in that row. In that case also, if there are no defective memory cells, "low" state output signals will be supplied from the sense amplifiers 2 to each of the set of FETs 8, so that line 10 will go to the "high" level. Hence, the potential of the line 10 is monitored when testing to detect that all bits of a data row are in the "0" state.

Even if an error occurs for one or more of the memory cells of a selected data row which should store all "0" data, so that the corresponding sense amplifier output (supplied to one of the set of FETs 5) goes to the "low" level instead of the "high" level, that will have no effect upon the state of the line 9, which will be held at the "low" level.

If on the other hand an even-numbered word line such as WL0 is selected and the stored contents of the corresponding word line data row all represent the logic "1" state, so the contents of the memory cells for that word line data row will all be at the "high" level, then "high" level outputs will be produced on each of the normal phase bit lines (BL0, BL1, BL2, ... ,BLm) and so from the corresponding outputs of the sense amplifiers 2, whereas "low" level outputs will be produced on each of the inverse phase bit lines (BL0, BL1, BL2, ... BLm). In that case, all of the set of transistors 8 will be set in the ON state, so that the line 10 will be at the "low" potential, while all of the transistors 5 will be set in the OFF state, so that the line 9 will be set at the "high" potential. If one or more of the bit lines (BL0, BL1, ... BLm) should go to the "high" state, due to a defective memory cell in the selected row, then the corresponding one of the transistors 5 will be set in the ON state, causing the line 9 to go to the "low" potential. In this case therefore, the set of transistors 5 is used to test the memory cells of the selected word line data row. In a similar way, if the selected word line is an odd-numbered line such as WL1, and the selected word line data row contains all "1" data (represented as "low" level contents of each of the memory cells of the selected row), all of the transistors 5 will be set in the OFF state if there is no defective memory cell. Thus in this case, the potential of the line 9 is monitored when testing to detect that all bits of a data row are in the "1" state.

Even if an error occurs for one or more of the memory cells of the selected data row, so that a "low" level signal is applied to the gate of the corresponding one of the set of transistors 8 instead of the "high" level, that will have no effect upon the state of the line 10, which will be held at the "low" level.

It can thus be understood that by first writing all "0" or all "1" state data into an arbitrarily selected word line data row, a test can be executed with this embodiment to detect any error of writing or reading the all "0" or all "1" data, by executing a single memory read access and monitoring the resultant potentials of the lines 9 and 10.

Diagrams (a) to (h) in FIG. 7 show six different data test patterns which can be written into all of the cells of a memory cell array. Only a portion of the entire pattern is shown in each case, and it will be understood that the identical pattern is repeated throughout the array. The patterns of FIG. 7 represent the data that are stored in the memory cell array, as opposed to the "low" and "high" contents of the memory cells which express the stored data, in the case of the folded bit line type of memory described above.

Each of the test patterns of diagrams (a) to (d) of FIG. 7 can be used with the embodiment of FIG. 3. After writing the test pattern data into all of the memory cells, successive ones of the (WL0, WL1, . . . WLn) are addressed to read out the contents of the corresponding word line data row, and the resultant states of the bit lines 9 and 10 are monitored as described hereinabove, to determine whether the all "0" data or all "1" data stored in each row have been correctly written into and read out from the memory cells of that row. The test patterns of diagrams (a) and (b) are used to test whether "0" data and "1" data can each be written into and read out from all of the memory cells. The test patterns of diagrams (c) and (d) of FIG. 7 can be utilized with the first embodiment as described above for the patterns of diagram (a) and (b), but also serve to test for any bit errors in the data read out from each row, which arise due to inter-word data interference.

Figure 4:
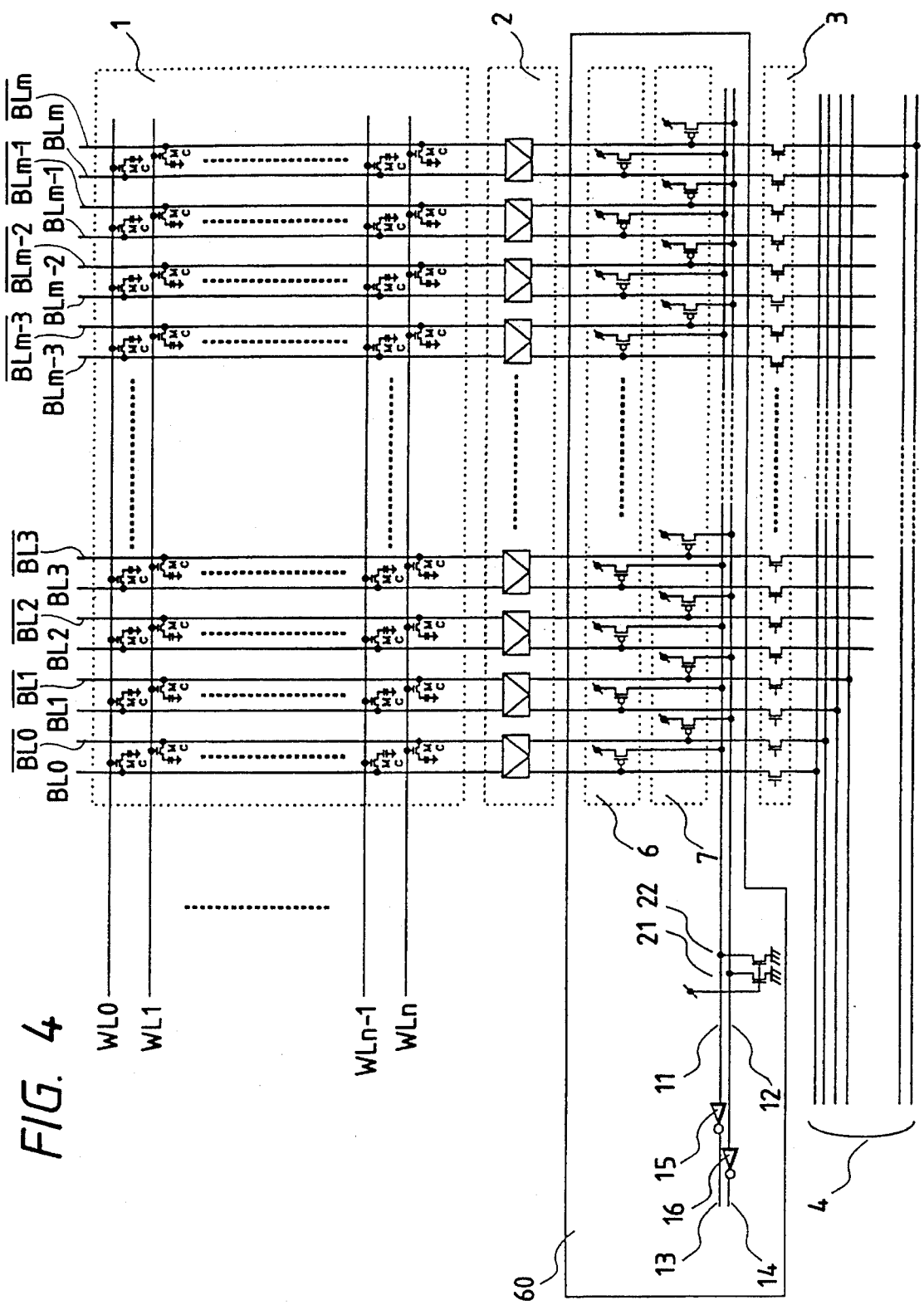
FIG. 4 is a partial circuit diagram of a second embodiment of the present invention, which is a RAM according to the present invention incorporating a memory test circuit that is an alternative to the test circuit of FIG. 3.

A second embodiment of the present invention will be described referring to FIG. 4. In FIG. 4, components corresponding to components in the embodiment of FIG. 3 are designated by corresponding reference numerals, and further description will be omitted. In this embodiment, a test circuit 60 performs similar test functions to those of the memory test circuit 50 of the first embodiment described above. However whereas in the first embodiment the memory test circuit 50 incorporates two sets of n-channel FETs 5 and 8, the test circuit 60 incorporates a set of p-channel FETs 6 having the gate electrodes thereof respectively connected to the output lines from the sense amplifiers 2 in an identical manner to the gate electrodes of the n-channel FETs 8 of the first embodiment, and a set of p-channel FETs 6 having the gate electrodes thereof respectively connected to the output lines from the sense amplifiers 2 in an identical manner to the gate electrodes of the n-channel FETs 5 of the first embodiment. All of the source electrodes of the sets of transistors 6 and 7 are connected to a positive supply voltage. The drain electrodes of the p-channel FETs 6 are connected in common to a connecting line 11, while the drain electrodes of the p-channel FETs 7 are connected in common to a connecting line 12. The line 11 is connected via a n-channel FET 22, functioning as a resistive load, to ground potential, while the line 12 is similarly connected via a n-channel FET 21, with the gate electrodes of the n-channel FETs 21, 22 connected to the positive supply voltage. The line 11 is connected through an inverter 15 to an output line 13, while the line 12 is connected through an inverter 16 to an output line 14. Each of the lines 13 and 14 can be monitored from the exterior of the memory chip.

During memory testing using this embodiment, when an arbitrary word line data row is selected to be read out, for example by addressing the word line WL0, then if for example the contents of that word line data row are all in the logic "1" state, the contents of the memory cells for that word line data row will all be at the "high" level. Hence, "high" level outputs will be produced on each of the normal phase bit lines (BL0, BL1, BL2, . . . ,BLm), and so respective "high" level outputs will be produced from each of the corresponding output lines of the sense amplifiers 2. Thus, all of the set of transistors 6 will receive "high" level inputs and so will be set in the OFF state, so that the line 11 will be at the "low" potential, thereby causing the line 13 to be set at the "high" potential. On the other hand, all of the transistors 7 will receive "low" level outputs from the sense amplifiers 2 and so will each be set in the ON state, so that the line 12 will be set at the "high" potential, and hence the line 14 will be set at the "low" potential. If one or more of the normal phase bit lines (BL0, BL1, . . . , BLn) of the selected row goes to the "low" state, due to a defective memory cell, then the corresponding one of the transistors 6 will be set in the ON state, causing the line 11 to go to the "high" potential, so that the line 13 goes to the "low" potential, thereby indicating that there is a bit error. In this case therefore, the state of the line 13 is monitored, to obtain the test result for any arbitrarily selected word line data row containing all "1" data.

It will be understood that the above is also true when an inverse phase bit line, e.g. WL1 is selected for reading out the corresponding word line data row, if all "1" data have been stored in that row. In that case also, if there are no defective memory cells, "high" state output signals will be supplied from the sense amplifiers 2 to each of the set of FETs 6, so that line 11 will go to the "low" level, and therefore line 13 will go to the "high" level. However if there is any bit error in the selected row, line 13 will go to the "low" level.

Even if an error occurs for one or more of the memory cells of a selected data row which should store all "1" data, so that the corresponding sense amplifier output that is supplied to one of the set of FETs 7 goes to the "high" level instead of the "low" level, that will have no effect upon the state of the line 12, which will be held at the "high" level.

If on the other hand an even-numbered word line such as WL0 is selected and the stored contents of the corresponding word line data row all represent the logic "0" state, so that the contents of the memory cells for that word line data row will all be at the "low" level, then "low" level outputs will be produced on each of the normal phase bit lines (BL0, BL1, BL2, . . . ,BLm), and from the corresponding outputs of the sense amplifiers 2, whereas "high" level outputs will be produced on each of the inverse phase bit lines ($\overline{BL0}$, $\overline{BL1}$, $\overline{BL2}$, . . . $\overline{BLm}$). In that case, all of the set of transistors 6 will be set in the ON state, so that the line 11 will be at the "high" potential, and therefore the line 13 set at the "low" potential, whereas all of the transistors 7 will be set in the OFF state, so that the line 12 will be set at the "low" potential, and hence line 14 set at the "high" potential. If one or more of the normal phase bit lines (BL0, BL1, . . . BLm) goes to the "high" state, due to a defective memory cell in the selected word line data row, then the corresponding one of the transistors 7 will be set in the ON state, causing the line 12 to go to the "high" potential, and the output line 14 to go to the "low" potential. In this case therefore, the set of transistors 7 is used to test the memory cells of the selected word line data row. In a similar way, if the selected word line is an odd-numbered line such as WL1, and the selected word line data row contains all "0" data (represented as "high" level contents of each of the memory cells of the selected row), all of the transistors 7 will again be set in the OFF state if there is no defective memory cell, i.e. the output line 14 goes to the "high" level if there are no error bits in the selected word line data row.

It can thus be understood that with this embodiment as for the first embodiment described above, by first writing all "0"

or all "1" state data into an arbitrarily selected word line data row, a test can be executed with this embodiment to detect any error of writing or reading the all "0" or all "1" data for that word line data row, by executing a single memory read access operation, and monitoring the resultant states of the lines 13 and 14. As for the first embodiment, each of the test patterns (a) to (d) of FIG. 7 can be utilized, to test all of the array of memory cells 1.

Figure 5:
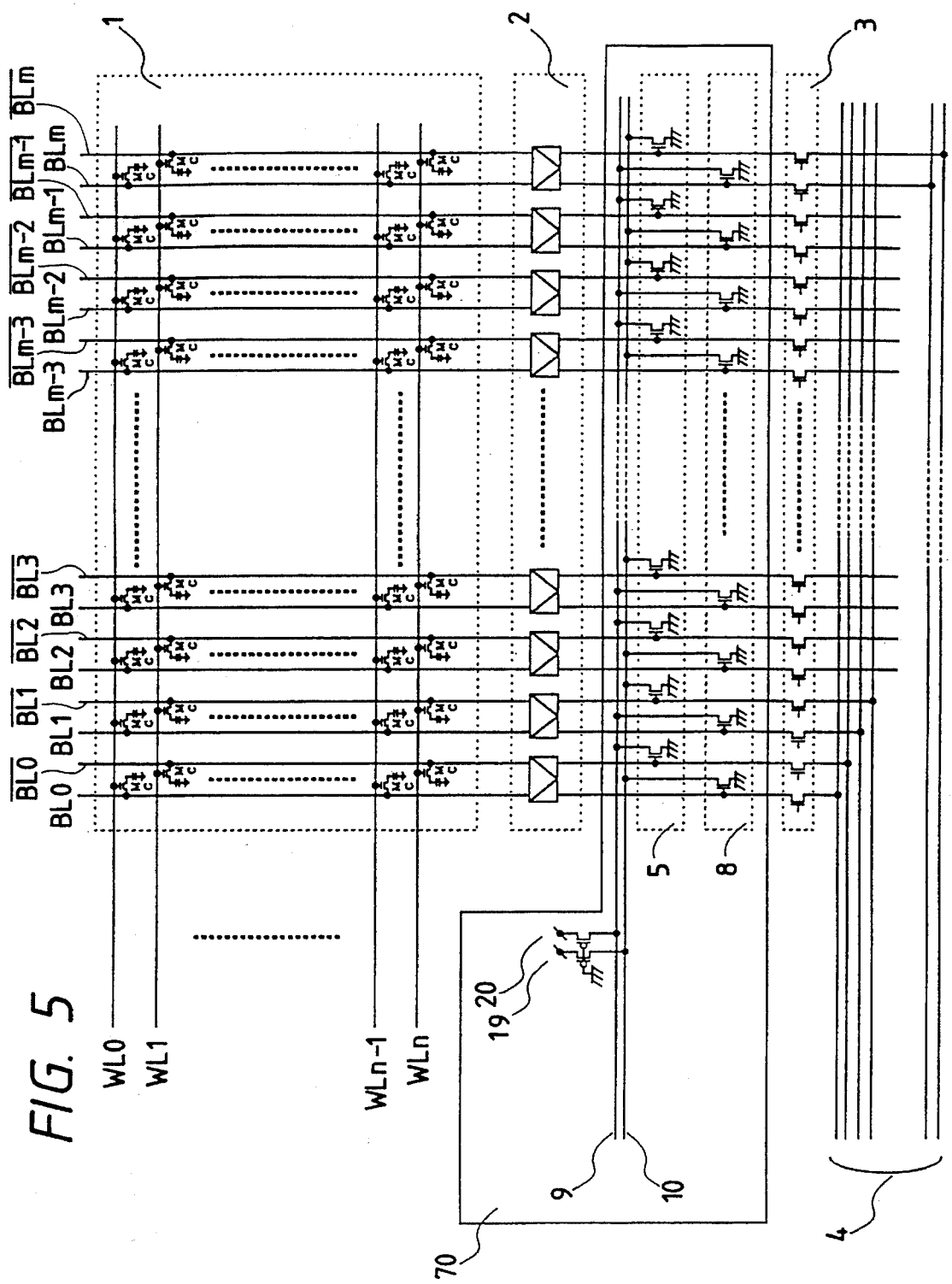
FIG. 5 is a partial circuit diagram of a third embodiment of the present invention, which is a RAM according to the present invention incorporating a memory test circuit for detecting that odd-numbered and even-numbered bits of a selected data row are respectively all in the "1" and all in the "0" states, or are all in the "0" and all in the "1" states.

With each of the two embodiments of the present invention described above, it is possible to test all of the memory cells for correct reading and writing for the case of all "0" data or all "1" data being written into all of the memory cells, and also to test for data intereference between word lines. However to fully test a semiconductor memory, it is also necessary to test for data interference between bit lines. That can be done by using a third embodiment of the present invention described in the following, in conjunction with the test patterns of diagrams (e) to (h) of FIG. 7 whereby alternating "1" and "0" data are stored in each word line data row. The third embodiment will be described referring to FIG. 5. In FIG. 5, components corresponding to components in the embodiment of FIG. 3 are designated by corresponding reference numerals, and further description will be omitted. The embodiment of FIG. 5 incorporates a memory test circuit 70, which differs from the memory test circuit 50 of the first embodiment of FIG. 3 only with respect to the drain connections of the sets of n-channel FETs 5 and 8. Specifically, in FIG. 5, each of the n-channel FETs 5 whose gate electrode is connected via the sense amplifiers 2 to one of the even-numbered inverse phase bit lines ($\overline{BL0}, \overline{BL2}, \ldots$) has the drain electrode thereof connected to the line 9, whereas each of the n-channel FETs 5 whose gate electrode is connected via the sense amplifiers 2 to one of the odd-numbered inverse phase bit lines ($\overline{BL1}, \overline{BL3}, \ldots$) has the drain electrode thereof connected to the line 10. Similarly, each of the n-channel FETs 8 whose gate electrode is connected via the sense amplifiers 2 to one of the odd-numbered normal phase bit lines (BL1, BL3, ...) has the drain electrode thereof connected to the line 9, while each of the n-channel FETs 8 whose gate electrode is connected via the sense amplifiers 2 to one of the even-numbered normal phase bit lines (BL0, BL2, ...) has the drain electrode thereof connected to the line 10. If the data which alternate between successive bits in the sequence (0,1,0,1,0 ...) have been set into an arbitrary one of the word line data rows, for example the row corresponding to the normal phase word line WL0, then the actual contents of the memory cells corresponding to WL0 will appear on the normal phase bit lines (BL0, BL1, BL2, ...) as "low", "high", "low", "high", ...), i.e. alternating between the "high" and "low" levels along that row of memory cells. If now WL0 is selected to read out the corresponding word line data row, all of the n-channel FETs whose drain electrodes are connected to the line 10 will be set in the OFF state, while all of the n-channel FETs whose drain electrodes are connected to the line 9 will be set in the ON state, so that the line 10 will go to the "high" level and line 9 to the "low" level. If there is any defective bit in the selected row, i.e. the corresponding one of the FETs whose drain electrodes are connected to the line 10 will not be set in the OFF state, so that the line 10 will go to the "low" potential.

It will be clear that if the same data sequence (0,1,0,1,0 ...) is set into a word line data row of one of the inverse phase word lines, e.g. WL1, so that the actual contents of the memory cells which are selected by that word line will appear on the inverse phase bit lines ($\overline{BL0}, \overline{BL1}, \overline{BL2}, \ldots$) as ("high", "low", "high", "low", ...) respectively, then since the respective outputs which are produced from the sense amplifiers 2 will be identical to those produced for the case of storing that data sequence in a word line data row expressed by a normal phase row of memory cells, the same test results will be obtained as described above for the example of WL0.

In a similar manner, if the data sequence (1, 0, 1, 0, ...) is set into an arbitrary one of the word line data rows, for example the row corresponding to the normal phase word line WL0, then the actual contents of the memory cells corresponding to WL0 will alternate in the sequence ("high", "low", "high", "low", ...) along that row of memory cells. If now WL0 is selected to read out the corresponding word line data row, all of the n-channel FETs whose drain electrodes are connected to the line 9 will be set in the OFF state, while all of the n-channel FETs whose drain electrodes are connected to the line 10 will be set in the ON state, so that the line 9 will go to the "high" level and line 10 to the "low" level. If there is any defective bit produced in the selected row, i.e. the corresponding one of the FETs whose drain electrodes are connected to the line 9 is not set in the OFF state, then the line 9 will go to the "low" potential, thereby indicating an error.

It will be understood from the preceding description that the same results will be obtained if the data sequence (1, 0, 1, 0, ...) is stored for a word line data row corresponding to one of the inverse phase word lines (e.g. WL1).

It can thus be understood that the embodiment of FIG. 5 enables testing of the memory cell array in units of word line data rows, i.e. testing of each of successive rows of the memory cells, to be executed using each of the test data patterns of diagrams (e) to (h) of FIG. 7, with the result of testing each row being expressed by the level of a specific one of two output lines 9 and 10.

Although the embodiment of FIG. 5 has been described for the case of utilizing sets of n-channel FETs 5 and 8 in the memory test circuit 70, it would be possible to obtain the same results by utilizing p-channel FETs in that test circuit, as described for the embodiment of FIG. 4.

With the embodiment of FIG. 5 the memory test circuit 70, in effect, functions to test the data read from a selected memory cell row as bit patterns, i.e. the bit pattern (0, 1, 0, 1, ...) and the bit pattern (1, 0, 1, 0, ...). By using a different arrangement of connections of the drain electrodes of the sets of transistors 5 and 8 to the lines 9 and 10 from the arrangement which is used in FIG. 5, it would be equally possible to selectively test other predetermined bit patterns of a selected memory cell row.

Figure 6:
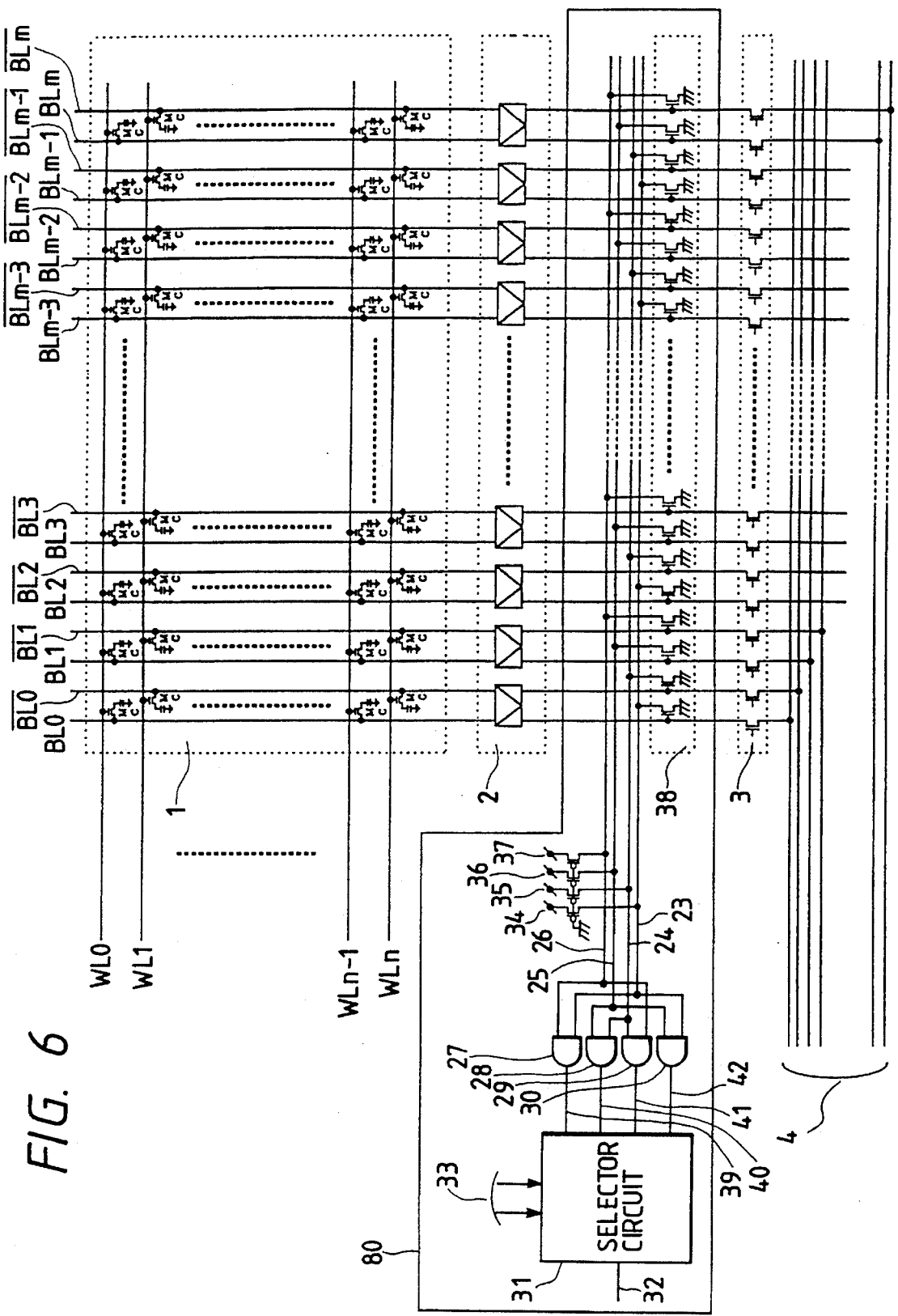
FIG. 6 is a partial circuit diagram of a fourth embodiment of the present invention, which is a RAM according to the present invention incorporating a memory test circuit which is controllable for detecting each of a plurality of respectively different bit sequences of a selected data row.

A fourth embodiment of the present invention will now be described. In order to comprehensively test a memory cell array, it is at least necessary to use a test pattern consisting of all "0" data, a test pattern consisting of all "1" data, a test pattern in which the bit sequence is (0 1 0 1 ... 0) in both the row and column directions, and a test pattern in which the bit sequence is (1 0 1 0 ... 0) in both the row and column directions. A fourth embodiment of the present invention will now be described which enables such testing to be executed, referring to FIG. 6. In FIG. 6, components corresponding to components in the embodiment of FIG. 3 are designated by corresponding reference numerals, and further description will be omitted. An memory test circuit 80 includes a set of n-channel FETs 38, each having the source electrode connected to ground potential, and having gate electrodes connected to the output lines from the sense amplifiers 2 which corresponding to the ($\overline{BL0}/BL0$, $\overline{BL1}/BL1$, ... $\overline{BLm}/BLm$), and having the drain electrodes connected to a set of lines 23 to 26. Four p-channel FETs 34 to 37 function as respective loads for the n-channel FETs which are connected to the lines 23 to 26. The memory test circuit 80 further includes a set of four AND gates 27 to 30 and a selector circuit 31. Of the set of n-channel FETs 38, each transistor which has the gate electrode thereof connected to one of the even-numbered normal phase bit lines (BL0, BL2, ..., BL(m−1)) has the drain electrode thereof connected to the line 23, each transistor which has the gate electrode thereof connected to one of the even-numbered inverse phase bit lines ($\overline{BL0}, \overline{BL2}, \ldots \overline{BL(m-+b\,1)}$) has the drain electrode thereof connected to the line 24, each transistor which has the gate electrode thereof connected to one of the odd-numbered normal phase bit lines (BL1, BL3, .. ., BLm) has the drain electrode thereof connected to the line 25, and each transistor which has the gate electrode thereof connected to one of the odd-numbered inverse phase bit lines ($\overline{BL1}, \overline{BL3}, \ldots, \overline{BLm}$) has the drain electrode thereof connected to the line 26.

The AND gate 27 has the inputs thereof respectively connected to the lines 23 and 26, AND gate 28 has the inputs thereof respectively connected to the lines 24 and 25, AND gate 29 has the inputs thereof respectively connected to the lines 24 and 26, AND gate 30 has the inputs thereof respectively connected to the lines 23 and 25. Respective output lines 39, 40, 41 and 42 from the AND gates 27, 28, 29 and 30 are connected to respective inputs of the selector circuit 31, with the potential level of one of these output lines 39 to 42 being selected to be produced on an output line 32 by the selector circuit 31 in accordance with the test mode bit selection signals 33. The application of the test mode bit selection signals 33 to the selector circuit 31 can be controlled from the exterior of the memory chip, and the state of the output line 32 can be monitored from the exterior of the memory chip.

The test operation of this embodiment is as follows. If for example a word line data row has been written into a memory cell row of the array 1 such that all of the even-numbered bits stored in that row are "0" and the data row is then read out, then if there are no even-numbered bit errors, all of the transistors of the set 38 which are connected to the line 23 will be set in the OFF state, so that the potential of line 23 goes to the "high" level. If there is any even-numbered bit error in the selected data row, then the corresponding one of the transistors connected to the line 23 will be in the ON state, so that the line 23 will be at the "low" level when that data row is read. If on the other hand all "1" state data have been stored for the even-numbered bits of an memory cell row, and the data row is then read out, then if there are no even-numbered bit errors in that row, the line 24 will go to the "high" level. If any of the even-numbered bits of that row is erroneously read as being in the "0" state, then line 24 will be at the "low" level when the row is read. If a word line data row has been written into a memory cell row of the array 1 such that all of the odd-numbered bits stored in that row are "0", and the data row is then read out, then if there are no odd-numbered bit errors, all of the transistors of the set 38 which are connected to the line 25 will be set in the OFF state, so that the potential of line 25 goes to the "high" level. If there is any odd-numbered bit error in the selected data row, then the corresponding one of the transistors connected to the line 25 will be in the ON state, so that the line 25 will be at the "low" level when that data row is read. If all "1" state data have been stored for the odd-numbered bits of an memory cell row, and the data row is then read out, then if there are no odd-numbered bit errors in that row, the transistors 38 which are connected to the line 26 will be set in the OFF state so that line 26 goes to the "high" level. If any of the odd-numbered bits of that row is erroneously read as being in the "0" state, then line 25 will to to the "low" state.

It can thus be understood that by using the information conveyed by the potentials of the lines 23 to 26 of this embodiment, the bits of a word line data row that is selected to be read out from the memory cell array 1 are in effect divided into odd-numbered and even-numbered bits, and it becomes possible to detect whether all of the odd-numbered bits of the selected row are all in the "0" or are all in the "1" state, and to similarly detect whether all of the even-numbered bits of that row are in the "0" or are all in the "1" state.

As a result of the combinations of connections of the lines 23 to 26 to inputs of the four AND gates 27 to 30, the output line 39 of AND gate 27 goes to the "high" level when the bit sequence of a word line data row that is read out is (0 1 0 1 ... 0 1), the output line 40 of AND gate 28 goes to the "high" level when the bit sequence of a word line data row that is read out is (1 0 1 0 ... 0), the output line 41 of AND gate 29 goes to the "high" level when the bit sequence of a word line data row that is read out consists of all "1" state bits, and the output line 42 of AND gate 30 goes to the "high" level when the bit sequence of a word line data row that is read out consists of all "0" state bits. Otherwise, the output lines 39 to 42 remain at the "low" level.

The potential level of one of the output lines 39 to 42 that is selected by the selector circuit 31, under the control of the test mode selection signals 33, is transferred to the output line 32. By controlling the selector circuit 31 in this way by the test mode selection signals 33 it becomes possible to test the entire array of memory cells 1 even if successive rows of the array have respectively different test patterns written therein. Thus, testing of the memory cell array 1 can be executed by using any of the test patterns (a) to (h) of FIG. 7, in units of word line data rows.

In the memory test circuit 80 of FIG. 6, a set of n-channel FETs 38 are utilized for detection of bit states of a selected word line data row, with the row divided into even-numbered and odd-numbered bits. However it would be equally possible to utilize a set of p-channel FETs for that purpose, as described hereinabove for the embodiment of FIG. 4.

Although it is assumed in the above that each of the described embodiments of the present invention is applied to a DRAM semiconductor memory, it would be equally possible to directly apply the respective bit coincidence detection circuits of the embodiments to a SRAM which also utilizes a configuration whereby the contents of each memory cell are read out as a differential signal appearing between a pair of bit lines, which is amplified by a differential sense amplifier.

With each of the embodiments of the present invention described above, during memory testing the entire contents of a selected row of cells of a memory cell array are read out and tested as a unit. Thus, the time required for testing the entire memory cell array can be substantially shortened by comparison with prior art arrangements for semiconductor memory testing.

Figure 2:
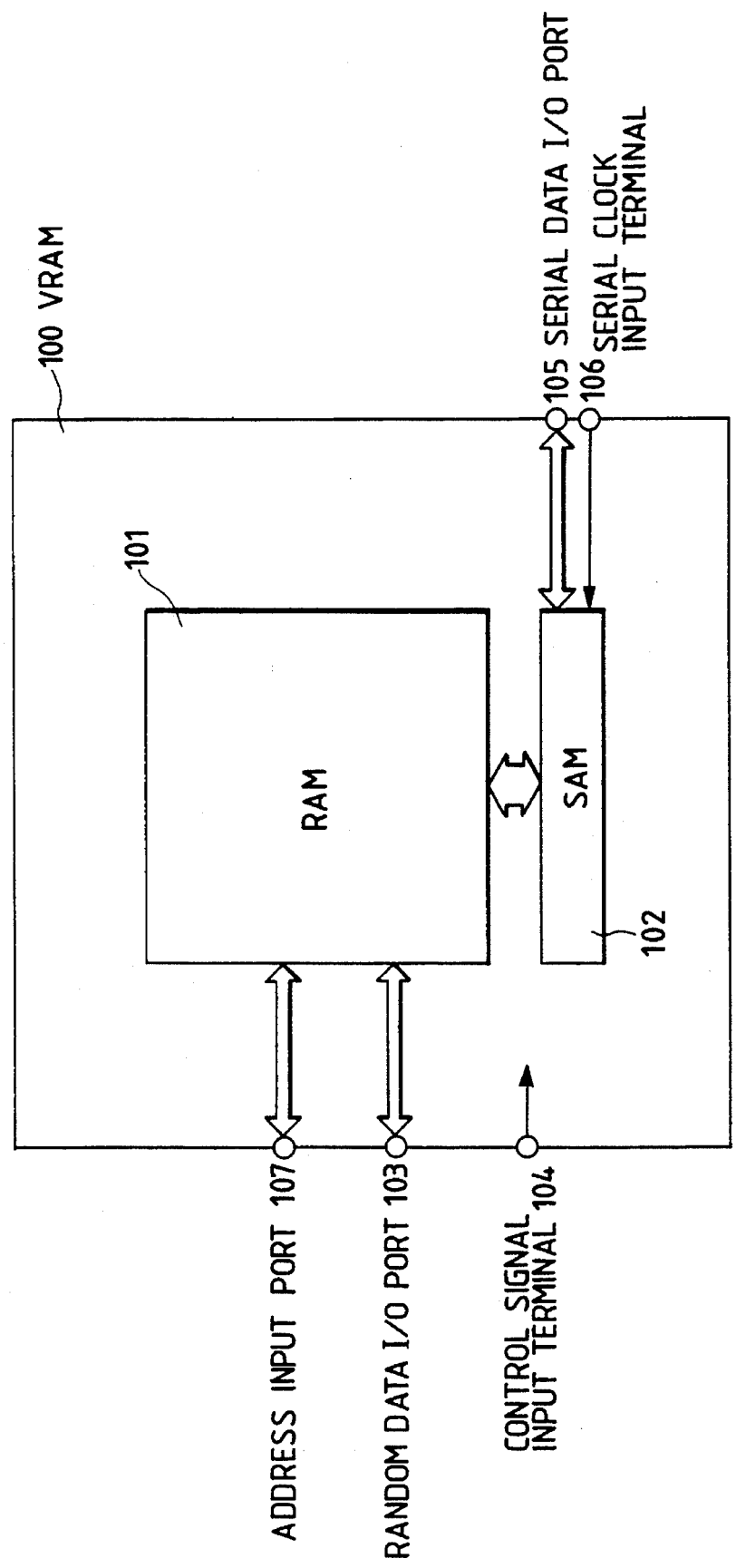
FIG. 2 is a block diagram of a prior art VRAM.

A fifth embodiment of the present invention will be described referring to the block diagram of FIG. 8, which is applied to a VRAM that is formed of a RAM and SAM, of the form shown in FIG. 2 and described hereinabove. For simplicity, the address and random data I/O ports of the RAM are omitted from FIG. 8. Data can be transferred into and out of the SAM 102 via the serial data I/O port 105, in synchronism with the serial clock signal from terminal 106, and a row of data (i.e. corresponding to a word line data row of a DRAM as defined hereinabove) can be read out and transferred directly from an arbitrarily selected memory cell row of an memory cell array of the 101, via the bit lines of the memory cell array, to be written in parallel into the SAM 102, or can be read out and transferred in parallel from the SAM 102 to be written into an arbitrarily selected row of memory cells of the RAM 101. The embodiment of FIG. 8 further includes a data shift register 110, having a path extending back from the output to the input of the register whereby data that has once been set into the register continuously recirculates in synchronism with the serial clock signal. The embodiment also includes a comparator 111 which functions to compare respective bits of data that are serially transferred out of the data shift register 110 during recirculation with corresponding bits of data that are serially read out from the SAM 102, with the comparison results (i.e. generated as successive "0" or "1" state bits) being serially produced from the comparator 111. In addition, a selector circuit 112 is controlled by a test mode signal, which is for example a 2-state signal that can be controlled from the exterior of the memory chip, and is applied to an input terminal 113, to cause the selection circuit 112 to either transfer data between the SAM 102 and the serial data I/O port 105 (i.e. during normal operation of the memory) or to transfer to the serial data I/O port 105 the comparison results produced from the comparator 111 (i.e. during testing of the memory).

The comparator 111 can be configured simply as an exclusive-OR gate whose output is inverted, so that any bit error will result in a "0" output being produced, with "1" outputs being otherwise produced as result data.

The operation of testing the RAM 101 with this embodiment is as follows. The test mode signal is first set to the condition whereby the selection circuit 112 transfers data between the SAM 102 and the serial data I/O port 105. Test pattern data for one row of memory cells of the RAM 101 (i.e. for a word line data row as described hereinabove) are then supplied serially from the exterior to the serial data I/O port 105, and transferred both to be written into the SAM 102 and also to be set into the data shift register 110, in synchronism with the serial clock signal. The test pattern data then begin to recirculate around the loop of that register. A write transfer operation of the RAM 101 is then executed, whereby the test data pattern that has thus been written into the SAM 102 is transferred in parallel to be written into an arbitrarily selected one of the rows of memory cells of the RAM 101. If the same test data are to be written into other rows of memory cells, then a write transfer is again executed to store the test data in another of these rows, and so on for each of the required rows.

The test mode signal is then set to a condition whereby the selection circuit 112 transfers data from the output of the comparator 111 to the serial data I/O port 105. A read transfer operation is then executed for the RAM 101, to read out the contents of an arbitrarily selected one of the rows of memory cells, i.e. to read a data row out of the RAM 101, to be written in parallel into the SAM 102. The data thus written into the SAM 102 are then read out serially in synchronism with the serial clock signal, beginning at a time point which coincides with a time at which the start of the test data pattern is being shifted out the data shift register 110. Successive bits of the original test pattern data (from the data shift register 110) and the test pattern data which have been written into and read out from the RAM 101 are thereby sequentially compared by the comparator 111, and the test results from the comparator 111 are transferred via the selection circuit 112 out from the serial data I/O port 105 to the exterior of the memory.

A second read transfer operation for the RAM 101 is then executed, to read out a second word line data row, with the test results for that row then being outputted from the serial data I/O port 105 as described above, and so on successively for all of the memory cell rows of the RAM 101 in which that test pattern was written.

With the above embodiment, since the test data pattern is written into and read out from the RAM 101 in units of word line data rows, as for the preceding embodiments, with the test results obtained for each row being immediately transferred out from the serial data I/O port 105 after the test pattern row has been read from the RAM 101, the time required to test all of the memory cells of the RAM section of a VRAM can be made substantially shorter than has been possible in the prior art.

With the embodiment described above, arbitrary test pattern data can be rapidly written into all of the memory cells of the RAM 101, however identical test data are written into each of the rows of memory cells.

Figure 9:
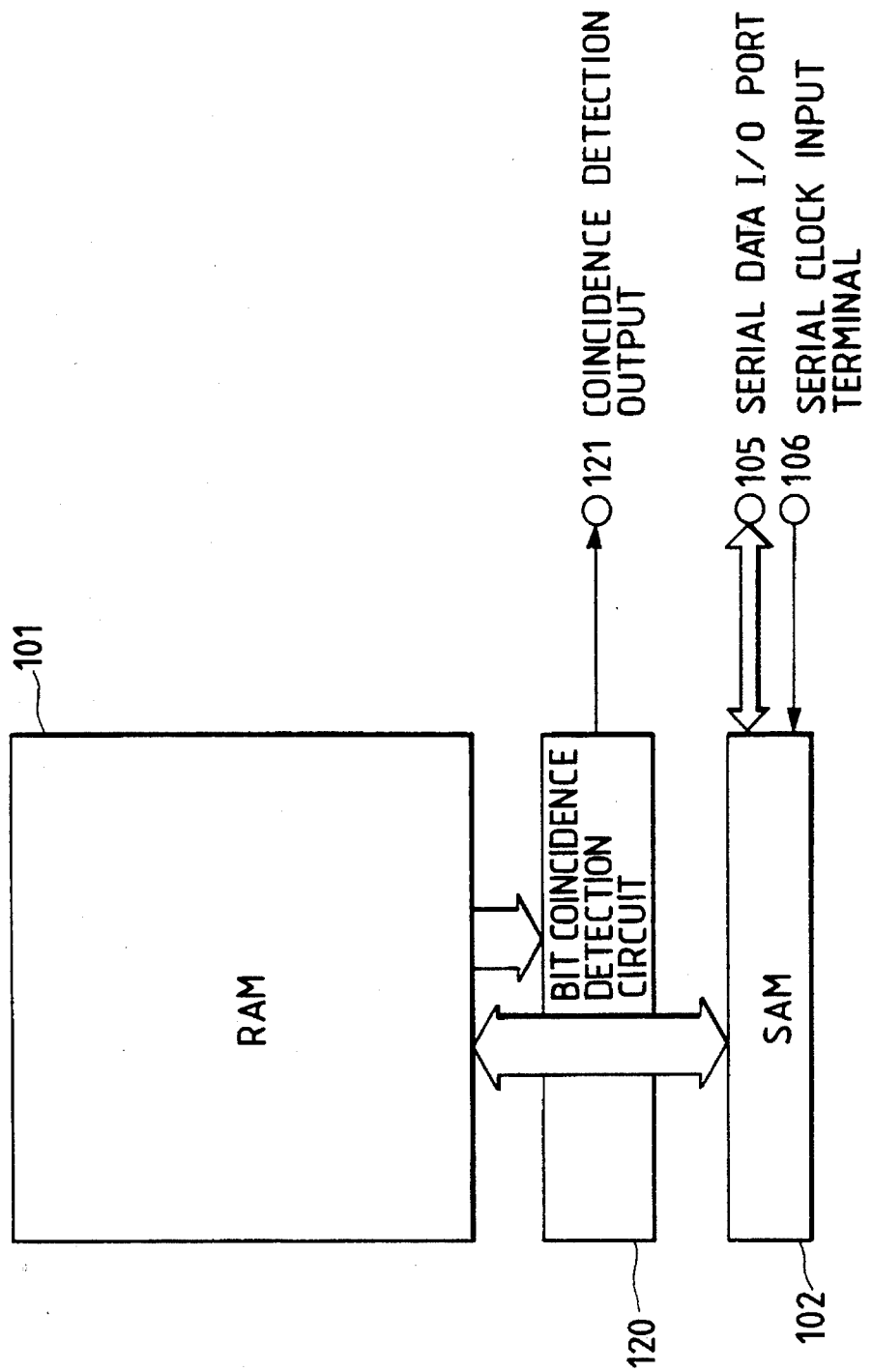
FIG. 9 is a general block diagram of a sixth embodiment of the present invention, which is a VRAM incorporating a memory test circuit based on a static shift register circuit and static comparison of data bits.

A sixth embodiment of the present invention will be described, which is also applied to a VRAM, referring to FIG. 9. This embodiment differs from the VRAM of FIG. 2 described hereinabove in that a bit coincidence detection circuit 120 is provided, for comparison of data read out from the RAM 101 with a row of data which are held in the SAM 102. Specifically, all of the bit lines of the RAM 101 are connected to respective inputs of the bit coincidence detection circuit 120, while all of the parallel outputs of the SAM 102 are also connected to inputs of the bit coincidence detection circuit 120. The comparison results obtained by the bit coincidence detection circuit 120 are transferred to the exterior via a coincidence signal output terminal 121. The normal operation of this embodiment, for writing and reading of data to/from the RAM 101 and the SAM 102 is identical to that described hereinabove for the prior art example of FIG. 2.

The operation of this embodiment for testing the memory cells of the RAM 101 is as follows. Firstly, arbitrary test pattern data for one memory cell row of the RAM 101 are supplied from the exterior, via the serial data I/O port 105, to be written into the SAM 102. Successive write transfer operations of the RAM 101 are then executed to sequentially write the test pattern data into each of the memory cell rows of the RAM 101. When that is completed, a read transfer operation of the RAM 101 is executed, to read out an arbitrarily selected word line data row from a row of memory cells of the RAM 101, whereby the data thus read out are compared in the bit coincidence detection circuit 120 with the original test pattern data which are held stored in the SAM 102. The result of the comparison is produced as output data from the bit coincidence detection circuit 120, to be supplied to the coincidence detn signal output terminal 121. A read transfer operation is then executed for another one of the rows of memory cells of the RAM 101, the comparison result obtained, and so on for all of the rows of memory cells of the RAM 101.

Figure 10:
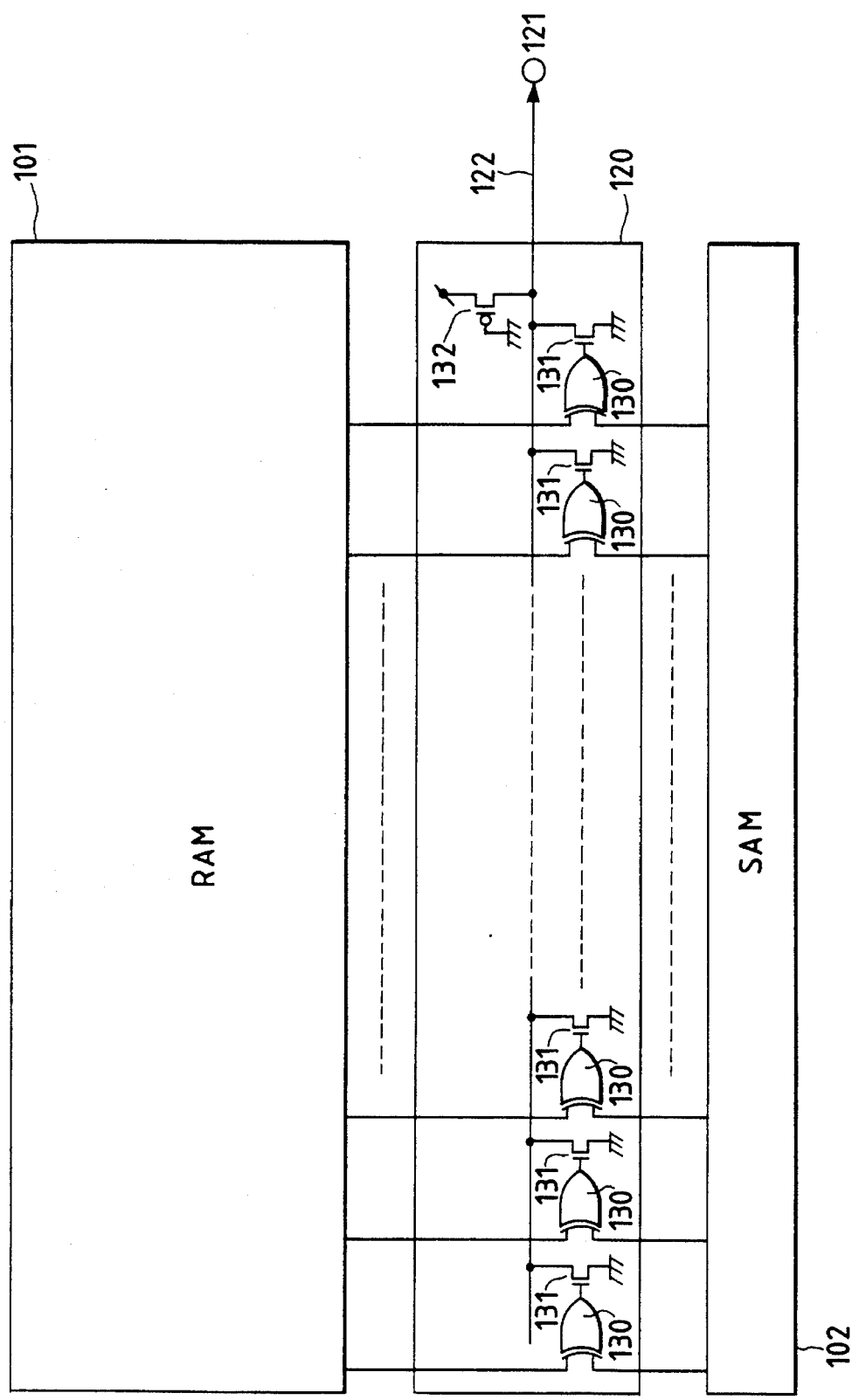
FIG. 10 shows a specific configuration for a comparator circuit in the embodiment of FIG. 9.

FIG. 10 illustrates a specific internal configuration for the bit coincidence detection circuit 120. This includes a set of exclusive-OR gates 130, each having the output thereof connected to the gate electrode of a corresponding one of a set of n-channel FETs 131. The source electrodes of all of the n-channel FETs 131 are connected to ground potential, and the drain electrodes are connected in common to a connecting line 122 which is connected to the terminal 121 and which is also connected to a p-channel FET which is connected as shown to a positive supply voltage, to function as a load for each of the n-channel FETs 131. Each of the exclusive-OR gates 130 produces an output at the "low" level if the two inputs thereof are identical, an output at the "high" level if the two inputs are not mutually identical. Thus, the output produced from the terminal 121 will only go to the "high" level (i.e. representing the "1" logic state) if all of the outputs from the exclusive-OR gates 130 are at the "low" level so that all of the n-channel FETs 131 are in the OFF state. If there is a difference between one or more bits of a word line data row that is read out from the RAM 101 and the corresponding bit or bits of the original test pattern data that is held in the SAM 102, then one or more of the n-channel FETs 131 will be set in the ON state, so that the terminal 121 will be set to the "low" level (i.e. logic "0" state). Thus, test result data for each of the rows of memory cells of the RAM 101 are produced from the terminal 121, as successive word line data rows are read from the RAM 101 during testing. The output lines from the RAM 101, which are connected to respective inputs of the exclusive-OR gates 130 of the bit coincidence detection circuit 120 in FIG. 10, are coupled to respective bit lines of the RAM 101.

It can thus be understood that with the above embodiment, all of the memory cells of the RAM 101 can be rapidly tested, since testing is executed by reading out the RAM contents in units of rows of the memory cell array.

Figure 8:
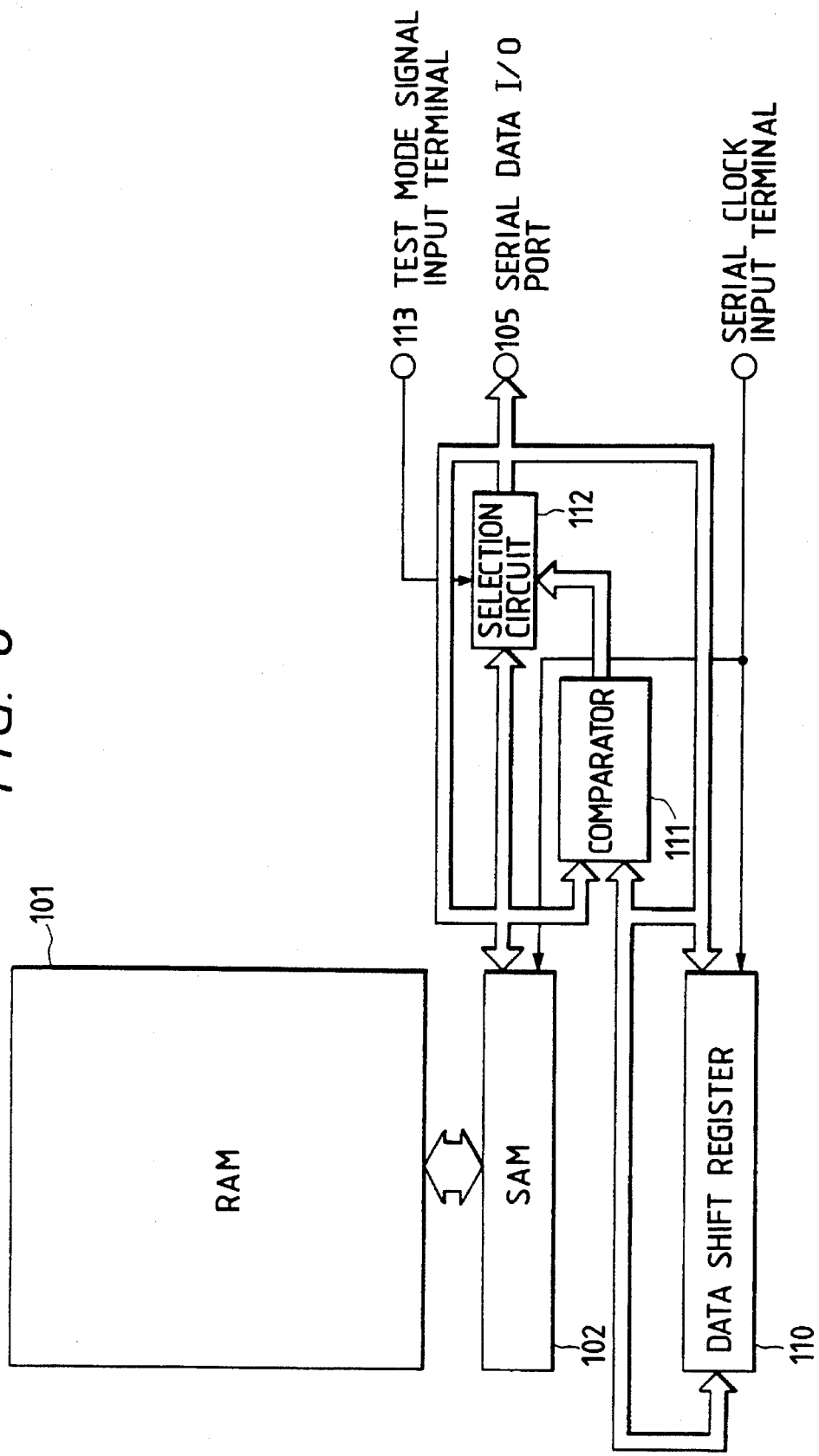
FIG. 8 is a general block diagram of a fifth embodiment of the present invention, which is a VRAM incorporating a memory test circuit based on a recirculating shift register circuit and serial comparison of data bits.
Figure 11:
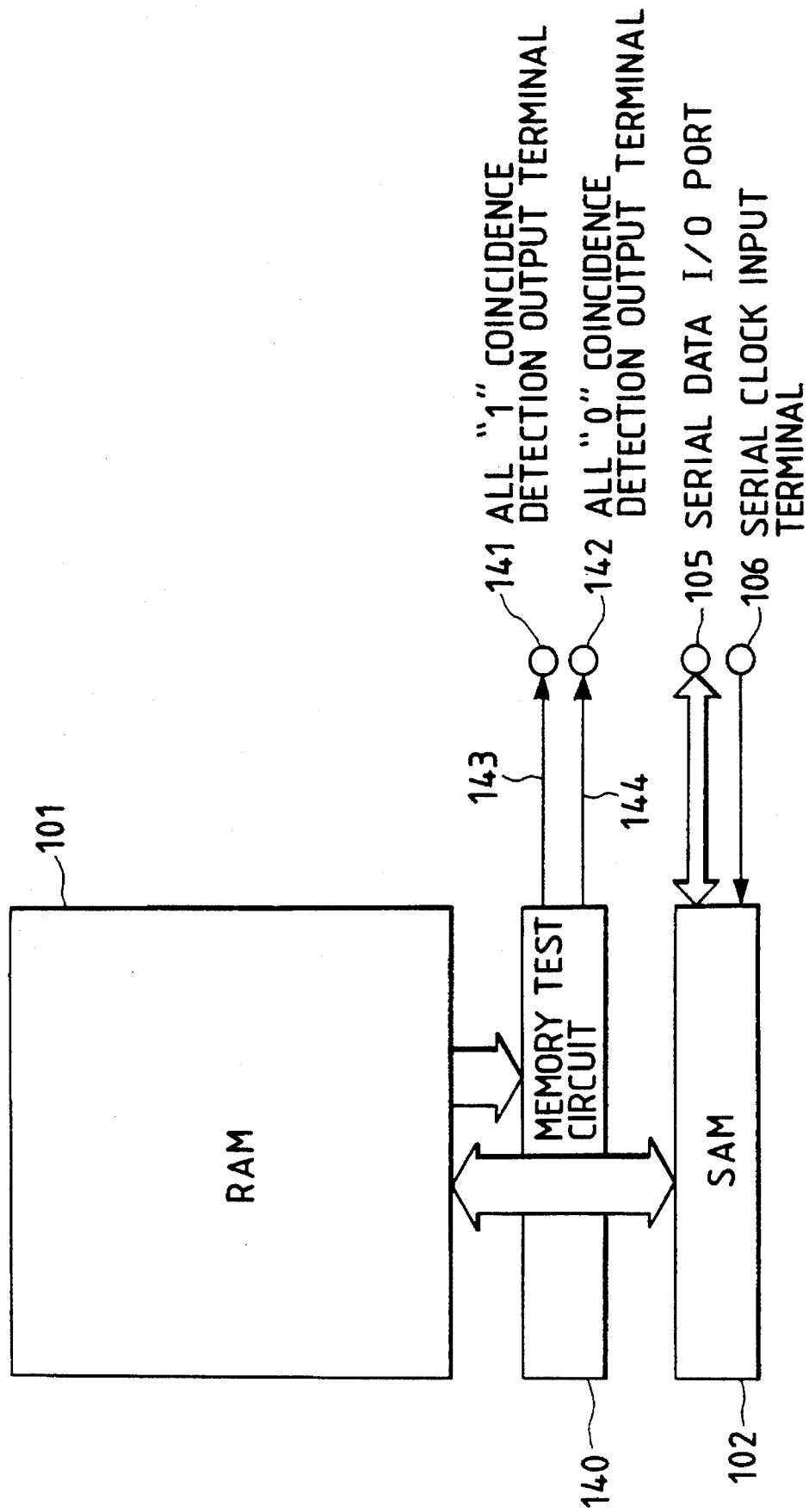
FIG. 11 is a general block diagram of a seventh embodiment of the present invention, which is a VRAM incorporating a memory test circuit essentially identical to that of the embodiment of FIG. 3.
Figure 12:
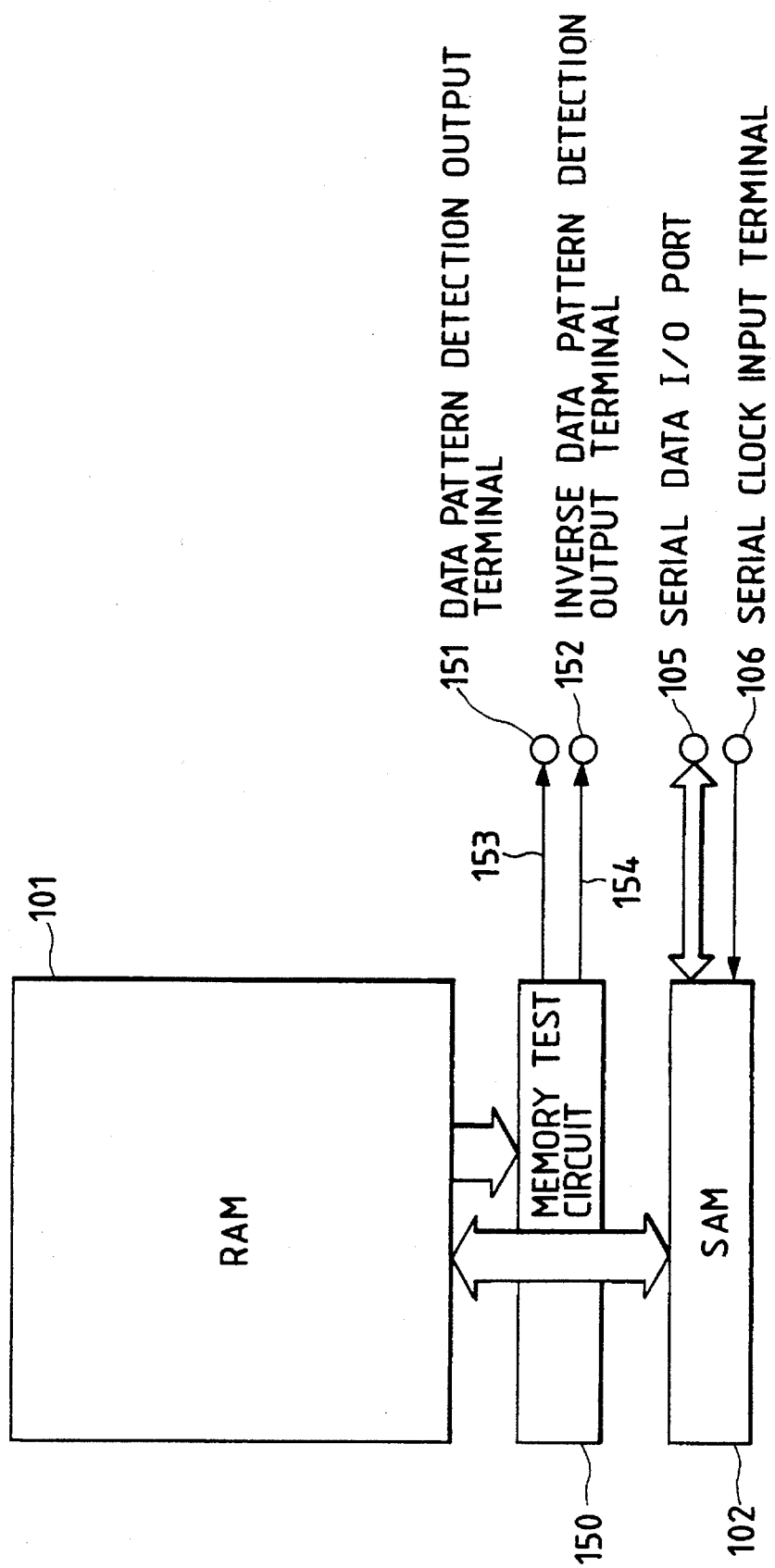
FIG. 12 is a general block diagram of an eighth embodiment of the present invention, which is a VRAM incorporating a memory test circuit essentially identical to that of the embodiment of FIG. 5.
Figure 13:
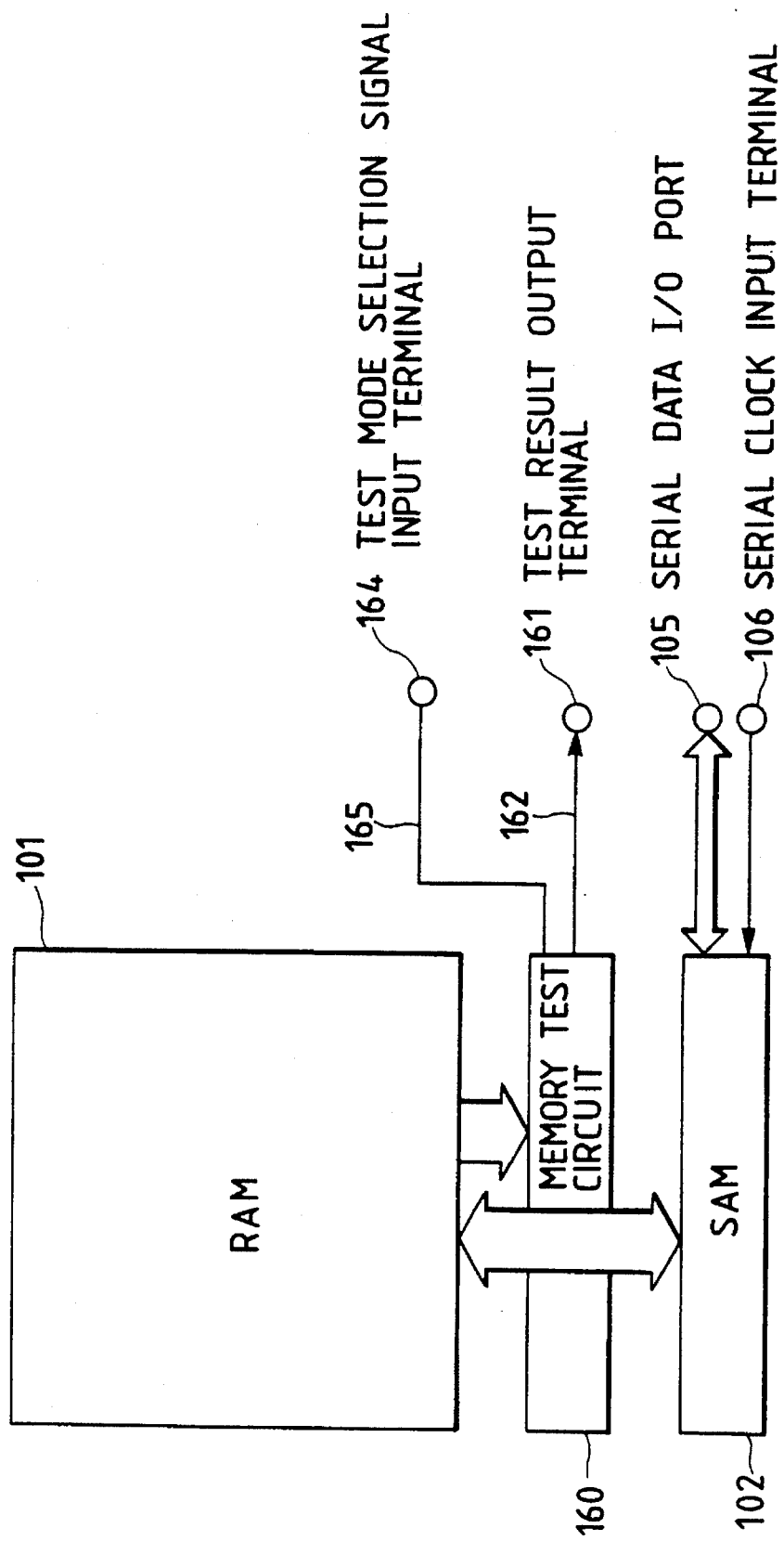
FIG. 13 is a general block diagram of a ninth embodiment of the present invention, which is a VRAM incorporating a memory test circuit essentially identical to that of the embodiment of FIG. 6.

With the above embodiment, as for the embodiment of FIG. 8, an identical arbitrarily determined row of test pattern data is written into each of the memory cell rows of the RAM 101. Embodiments of the present invention will now be described, referring to FIGS. 11, 12 and 13, whereby arbitrary test data patterns can be written into respective rows of memory cells of the RAM 101. The configuration of a test circuit and the test operation for the embodiments of FIGS. 11, 12 and 13 are respectively identical to those of the embodiments of FIGS. 3, 5 and 6 described hereinabove.

A seventh embodiment of the present invention will be described referring to FIG. 11. This embodiment differs from the VRAM of FIG. 2 described hereinabove in that a memory test circuit 140 is provided, whose functions and internal configuration are identical to those of the memory test circuit 50 of the embodiment of FIG. 3 described hereinabove. That is to say, all of the bit lines of the RAM 101 are coupled (via sense amplifiers) to respective inputs of the memory test circuit 140. Specifically, if all of the bits of a data row that is read out from the RAM 101 are in the "0" state, then an output line 144 which is connected to an output terminal 142 goes to the "high" level (i.e. "1" state), whereas if all of the bits of the data row are in the "1" state then an output line 143 that is connected to an output terminal 141 goes to the "high" level.

The normal operation of this embodiment, for writing and reading of data to/from the RAM 101 and the SAM 102 is identical to that described hereinabove for the prior art example of FIG. 2.

The operation of this embodiment for testing the memory cells of the RAM 101 is as follows. The test pattern data for one memory cell row of the RAM 101 are first supplied from the exterior, via the serial data I/O port 105, to be serially written into the SAM 102 in synchronism with the serial clock signal. The row of test pattern data can be either all "0" state data or all "1" state data. A write transfer operation of the RAM 101 is then executed, to store the test pattern data in a row of memory cells of the RAM 101. If it is assumed that all "0" or all "1" data are to be written throughout all of the memory cells of the RAM 101, then successive write transfer operations of the RAM 101 are thereafter similarly executed to sequentially write the test pattern data from the SAM 102 into each of the memory cell rows of the RAM 101. When that is completed, a read transfer operation of the RAM 101 is executed, to read out an arbitrarily selected data row from the memory cells of the RAM 101. If all "1" data have been written into that row, then if there are no bit errors, the output terminal 141 will go to the "high" level, but will attain the "low" level if there are any bit errors. Similarly, if all "0" data have been written into that memory cell row, then if there are no bit errors, the output terminal 142 will go to the "high" level, but will attain the "low" level if there are any bit errors.

It is assumed in the above that either all "0" or all "1" data are written into all of the memory cells of the RAM 101, for test purposes. However if for example the test pattern (c) of FIG. 7 is to be written into the memory cell array of the RAM 101, then this can readily be done by first writing in a test pattern data row having the all "0" bit sequence into the SAM 102, then writing that data row into the first, third, fifth, . . . rows of memory cells of the RAM 101, then writing a test pattern data row having the all "1'" bit sequence into the SAM 102, and writing that data row into the second, fourth, sixth . . . rows of memory cells of the RAM 101. In a similar way, the test pattern data (d) of FIG. 7 can be rapidly written into the memory cells of the RAM 101.

An eighth embodiment of the present invention will be described referring to FIG. 12. This embodiment differs from the VRAM of FIG. 2 described hereinabove in that a memory test circuit 150 is provided, whose functions and internal configuration are identical to those of the memory test circuit 70 of the embodiment of FIG. 5 described hereinabove, and which is utilized to test the memory cell array of the RAM 101, i.e. all of the bit lines of the RAM 101 are coupled via sense amplifiers to respective inputs of the memory test circuit 150. Specifically, if all of the even-numbered bits of a data row that is read are "0" and all odd-numbered bits are "1", then an output line 153 which is connected to an output terminal 151 goes to the "high" level (i.e. "1" state), whereas if all of the odd-numbered bits of the data row that is read are "0" and all even-numbered bits are "1" an output line 154 of an output terminal 152 goes to the "high" level.

The normal operation of this embodiment, for writing and reading of data to/from the RAM 101 and the SAM 102 is identical to that described hereinabove for the prior art example of FIG. 2.

The operation of this embodiment for testing the memory cells of the RAM 101 is as follows. The test pattern data for one memory cell row of the RAM 101 are first supplied from the exterior, via the serial data I/O port 105, to be serially written into the SAM 102 in synchronism with the serial clock signal.. The row of test pattern data can have the bit sequence (0 1 0 1 . . . 1) or (1 0 1 0 . . . 0), as described hereinabove for the embodiment of FIG. 5. A write transfer operation of the RAM 101 is then executed, to store the test pattern data as a data row in the memory cells of the RAM 101. If for example the test pattern (e) or (f) of FIG. 7 is to be written into all of the memory cells of the RAM 101, then successive write transfer operations of the RAM 101 are thereafter similarly executed to sequentially write the test pattern data from the SAM 102 into each of the memory cell rows of the RAM 101. When that is completed, a read transfer operation of the RAM 101 is executed, to read out an arbitrarily selected data row from the memory cells of the RAM 101. If the test pattern (0, 1, 0, 1, . . . ) is read out, then if there are no bit errors, the terminal 151 will go to the "high" level, but will attain the "low" level if there are any bit errors. Similarly, if the data pattern (1, 0, 1, 0, . . . ) has been written in for the selected data row then if there are no bit errors, the terminal 152 will go to the "high" level, but will attain the "low" level if there are any bit errors.

If for example the test pattern (g) of FIG. 7 is to be written into the memory cell array of the RAM 101, then this can readily be done by first writing in a test pattern data row having the bit sequence (0 1 0 1 . . . 1) into the SAM 102, then writing that data row into the first, third, fifth, . . . rows of memory cells of the RAM 101, then writing a test pattern data row having the bit sequence (1 0 1 0 . . . 0) into the SAM 102, then writing that data row into the second, fourth, sixth . . . rows of memory cells of the RAM 101. In a similar way, the test pattern data (h) of FIG. 7 can be rapidly written into the memory cells of the RAM 101.

It can thus be understood that this embodiment enables testing of the memory cell array of the RAM 101 to be executed by using any of the test patterns (e) to (h) of FIG. 7, for thereby testing for the occurrence of bit errors in writing and reading data to/from the RAM 101 as a result of data interference between bit lines. As for the preceding embodiments, the advantage is obtained of a high speed of testing, since data are read out from the memory cells of the RAM 101 in units of data rows to be tested by the memory test circuit 150.

A ninth embodiment of the present invention will be described referring to FIG. 13. This embodiment differs from the VRAM of FIG. 2 described hereinabove in that a memory test circuit 160 is provided, whose functions and internal configuration are identical to those of the memory test circuit 80 of the embodiment of FIG. 6 described hereinabove, and which is utilized to test the memory cell array of the RAM 101, i.e. with the parallel outputs of the RAM 101 being coupled to respective inputs of the memory test circuit 160. An output line 162 of the memory test circuit 160 corresponds to the output line 32 of the selector circuit 31 in the embodiment of FIG. 6, which goes to the "high" level (i.e. logic "1" state) if no error is detected when a data row is read out from the RAM 101, and goes to the "low" level if a bit error occurs. An input control signal applied from the exterior to an input line 165 of the 160 from an input terminal 164 determines the state of the test mode selection signals applied to the selector circuit 31 of the memory test circuit 160, to thereby select one out of four possible test modes as described hereinabove for the embodiment of FIG. 6, in accordance with the test pattern that has been previously written into a memory cell row whose contents are being read out during testing.

Each test data pattern row is written serially into the SAM 102 and then into an arbitrarily selected one of the rows of memory cells of the RAM 101, as described for the embodiments of FIGS. 11, 12 above. However with this embodiment, each test data pattern row can consist of a pattern of all "0", all "1", all even-numbered bits "0" and all odd-numbered bits "1", or all even-numbered bits "1" and all odd-numbered bits "0". Thus, any of the test patterns (a) to (h) of FIG. 7 can be utilized.

As for the preceding embodiments, the advantage is obtained of a high speed of testing, since data are read out from the memory cells of the RAM 101 in units of data rows, to be tested by the memory test circuit 160.

As can be understood from the above description of embodiments, by providing a memory test circuit which is incorporated within a semiconductor memory such as a DRAM or SRAM, the present invention enables the memory cells to be very rapidly tested, since test pattern data which have been written into the memory cell array can be read out in units of data rows from respective entire rows of cells of the array. In addition, a simple test circuit can be used, formed essentially of a single FET provided for each bit line of the memory, which can detect whether there is a predetermined type of coincidence between the bits of a data row which is read out, i.e. whether the bits are in accordance with a predetermined test pattern which was written as the data row.

In addition, the invention can be effectively applied to a VRAM which is based on a RAM section and SAM section, for testing the RAM section. In that case, the further advantage is obtained that an identical test data pattern can be rapidly written into a plurality of rows of memory cells of the RAM section, by writing that pattern into the SAM section and then repetitively transferring the pattern in parallel to be written into the respective rows of the RAM section.

What is claimed is:

1. In a semiconductor memory circuit having an array of memory cells, word lines respectively addressable for selecting an arbitrary row of memory cells of said array to read out a stored data row as a data unit, and a plurality of sense amplifiers coupled via respective bit lines to columns of memory cells of said array for amplifying respective bits of said data row, memory test circuit means comprising detection means for detecting that all bits of said data row, coupled through said sense amplifiers, are in a mutually identical logic state, wherein said detection means comprises a plurality of field effect transistors having respective gate electrodes coupled through said sense amplifiers to respective ones of a set of said bit lines corresponding to said predetermined plurality of bits, and wherein drain electrodes of said field effect transistors are connected in common to a fixed resistive load.

2. A semiconductor memory circuit according to claim 1, wherein said detection means comprises first coincidence detection means for detecting that bits constituting said data row are all in a "0" logic state and second coincidence detection means for detecting that said bits are all in a "1" logic state.

3. In a semiconductor memory circuit having an array of memory cells, word lines respectively addressable for selecting an arbitrary row of memory cells of said array to read out a stored data row as a data unit, and a plurality of sense amplifiers coupled via respective bit lines to columns of memory cells of said array for amplifying respective bits of said data row, memory test circuit means comprising detection means for detecting that all bits of said data row, coupled through said sense amplifiers, are in a mutually identical logic state, said detection means comprising first coincidence detection means for detecting that bits constituting said data row are all in a "0" logic state and second coincidence detection means for detecting that said bits are all in a "1" logic state, wherein said memory cells are divided into normal-phase memory cells in which said "1" and "0" state bits of said stored data are represented by high and low potentials respectively, and inverse phase memory cells in which said "1" and "0" state bits of stored data are represented by low and high potentials respectively, said normal phase memory cells being respectively coupled to corresponding normal phase bit lines, and wherein said first coincidence detection means comprises a first plurality of field effect transistors having gate electrodes thereof coupled through said sense amplifiers to respective ones of said normal phase bit lines and having drain electrodes thereof connected in common to a first fixed resistive load, and said second coincidence detection means comprises a second plurality of field effect transistors having gate electrodes thereof coupled through said sense amplifiers to respective ones of said inverse phase bit lines and having drain electrodes thereof connected in common to a second fixed resistive load.

4. In a semiconductor memory circuit having an array of memory cells, word lines respectively addressable for selecting an arbitrary row of memory cells of said array to read out a data row as a data unit, and a plurality of sense amplifiers coupled via respective bit lines to columns of memory cells of said array for amplifying respective bits of said data row, memory test circuit means comprising detection means for detecting that all bits constituting said data row, coupled through said sense amplifiers, are in an arbitrarily predetermined combination of "1" and "0" logic states, wherein said memory cells are divided into rows of normal-phase memory cells in which "1" and "0" state bits of said stored data are represented by high and low potentials respectively, and rows of inverse phase memory cells in which said "1" and "0" state bits of stored data are represented by low and high potentials respectively, said normal phase memory cells being respectively coupled to corresponding normal phase bit lines and said inverse phase memory cells being respectively coupled to corresponding inverse phase bit lines, and wherein said detection means comprise a plurality of field effect transistors (5, 8) with gate electrodes of a first set of said plurality of field effect transistors being connected through said sense amplifiers to respective ones of said inverse phase bit lines which correspond to bits of said data row that are to be tested for the "1" logic state, and with gate electrodes of a second set of said plurality of field effect transistors being connected through said sense amplifiers to respective ones of said normal phase bit lines which correspond to bits of said data row that are to be tested for the "0" logic state, and wherein respective drain electrodes of said first and second sets are connected in common to a fixed resistive load (2) said sets being respectively predetermined in accordance with said combination of "1" and "0" logic states.

5. In a semiconductor memory circuit having a array of memory cells, word lines respectively addressable for selecting an arbitrary row of memory cells of said array to read out a data row as a data unit, and a plurality of sense amplifiers coupled via respective bit lines to columns of memory cells of said array for amplifying respective bits of said data row, memory test circuit means comprising:

first coincidence detection means for detecting that all odd-numbered bits of said data row are in a first logic state, and that all even-numbered bits of said data row are in a second logic state; and second coincidence detection means for detecting that all of said odd-numbered bits of said data row are in said second logic state, and that all of said even-numbered bits are in said first logic state, wherein said memory cells are divided into rows of normal-phase memory cells in which "1" and "0" state bits of said stored data are represented by high and low potentials respectively, and rows of inverse phase memory cells in which said "1" and "0" state bits of stored data are represented by low and high potentials respectively, said normal phase memory cells being respectively coupled to corresponding normal phase bit lines and said inverse phase memory cells being respectively coupled to corresponding inverse phase bit lines, wherein said first coincidence detection means comprises a first plurality of field effect transistors (8) having gate electrodes thereof coupled through said sense amplifiers to respective ones of said normal phase bit lines and with drain electrodes of even-numbered ones of said first plurality of field effect transistors being connected in common to a fixed resistive load (19) and odd-numbered ones of said first plurality of field effect transistors being connected in common to a second fixed resistive load (2), and wherein said second coincidence detection means comprises a second plurality of field effect transistors (5) having gate electrodes thereof coupled through said sense amplifiers to respective ones of said inverse phase bit lines, with respective drain electrodes of odd-numbered ones of said second plurality of field effect transistors being connected in common to said first resistive load and respective drain electrodes of even-numbered ones of said second plurality of field effect transistors being connected in common to said second resistive load.

6. In a semiconductor memory circuit having an array of memory cells, word lines respectively addressable for selecting an arbitrary row of memory cells of said array to read out a data row as a data unit, and a plurality of sense amplifiers coupled via respective bit lines to columns of memory cells of said array for amplifying respective bits of said data row, memory test circuit means comprising:

coincidence detection means for detecting that all bits of said data row are in a "1" logic state and producing a first output signal as a detection result, for detecting that all bits of said data row are in a "0" logic state and producing a second output signal as a detection result, for detecting that all even-numbered bits of said data row are in a "0" logic state and all odd-numbered bits of said data row are in a "1" logic state and producing a third output signal as a detection result, and for detecting that all even-numbered bits of said data row are in a "1" logic state and all odd-numbered bits of said data row are in a "0" logic state and producing a fourth output signal as a detection result;

signal combining means for producing a plurality of predetermined combinations of said first, second, third and fourth output signals; and test mode selection means controllable for selecting one of said combinations in accordance with a predetermined test data pattern that has been previously stored in said memory cells as said data row, wherein said memory cells are divided into rows of normal-phase memory cells in which said "1" and "0" state bits of said stored data are represented by high and low potentials respectively, and rows of inverse phase memory cells in which said "1" and "0" state bits of stored data are represented by low and high potentials respectively, said normal phase memory cells being respectively coupled to corresponding normal phase bit lines and said inverse phase memory cells being respectively coupled to corresponding inverse phase bit lines and said inverse phase memory cells being respectively coupled to corresponding inverse phase bit lines, and wherein said coincidence detection means comprises a plurality of field effect transistors (38), with a first set of said field effect transistors having gate electrodes thereof connected through said sense amplifiers to respective even-numbered ones of said normal phase bit lines, a second set of said field effect transistors having gate electrodes thereof connected through said sense amplifiers to respective odd-numbered ones of said normal phase bit lines, a third set of said field effect transistors having gate electrodes thereof connected through said sense amplifiers to respective even-numbered ones of said inverse phase bit lines, and a fourth set of said field effect transistors having gate electrodes thereof connected through sense amplifiers to respective odd-numbered ones of said inverse phase bit lines, wherein respective drain electrodes of said first set of field effect transistors are connected in common to a first resistive load (23), respective drain electrodes of said second set of field effect transistors are connected in common to a second resistive load (24), respective drain electrodes of said third set of field effect transistors are connected in common to a third resistive load (25), and respective drain electrodes of said fourth set of field effect transistors are connected in common to a fourth resistive load (26), wherein said signal combining means comprise a plurality of logic gate circuits (27, 28, 29, 30) each coupled to a plurality of aid common connections to said resistive loads, and wherein said test mode selection means comprises means (31) controlled for selecting one of a plurality of output signals produced from said logic gate circuits, in accordance with said test data pattern that has been stored as said data row.

7. In a video random access memory circuit including a random access memory having an array of memory cells, a serial access memory and a serial data input/output port, and means for writing into said serial access memory a data row which is transferred serially through and serial data input/output port, for writing said data row in parallel into an arbitrarily selected row of said array of memory cells of said random access memory, for reading the contents of an arbitrarily selected memory one of said rows of memory cells as a data row and writing said data row in parallel into said serial access memory, and for reading said data row from said serial access memory to be transferred out through said serial data input/output port, memory test circuit means for comparing said data row that is read out from said memory cells with said data row in a condition prior to being written into and read out from said memory cells, said memory test circuit means comprising a coincidence detection circuit (120) for comparing respective bits of a test data row, which are being read out from said random access memory after having been written into a row of memory cells thereof, with corresponding bits of said test data row which are held in said serial access memory, and for producing a bi-level output signal as a test result, wherein said coincidence detection circuit comprises a plurality of exclusive-OR gates (130) each coupled to receive one bit of said test data row which is held in said serial access memory, and a plurality of field effect transistors (131) having gate electrodes thereof connected to respective outputs of said exclusive-OR gates and having drain electrodes thereof connected in common to a fixed resistive load.

8. A video random access memory circuit according to claim 7, wherein said memory test circuit means comprises:

recirculating shift register means (110);

comparator means (111) for comparing respective bits of a test data row which is being serially read out from said serial data input/output port after having been written into and read out from a row of said memory cells of said random access memory, with corresponding bits of said test data row which are recirculating in said recirculating shift register means, to serially produce respective bits of test result data; and selector circuit means (112) coupled between said serial data input/output port and each of said comparator means and recirculating shift register means and controlled by an externally supplied test mode signal, for transferring arbitrary data between said serial access memory and said serial data input/output port in a normal mode of operation and for transferring said test result data from said comparator means to said serial data input/output port in a test mode of operation.

\* \* \* \* \*